(12) United States Patent
Paterson et al.

(10) Patent No.: US 7,674,394 B2
(45) Date of Patent: Mar. 9, 2010

(54) PLASMA PROCESS FOR INDUCTIVELY COUPLING POWER THROUGH A GAS DISTRIBUTION PLATE WHILE ADJUSTING PLASMA DISTRIBUTION

(75) Inventors: Alexander Paterson, San Jose, CA (US); Valentin N. Todorov, Palo Alto, CA (US); Theodoros Panagopoulos, San Jose, CA (US); Brian K. Hatcher, San Jose, CA (US); Dan Katz, Saratoga, CA (US); Edward P. Hammond, IV, Hillsborough, CA (US); John P. Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 11/679,122

(22) Filed: Feb. 26, 2007

(65) Prior Publication Data

US 2008/0206483 A1 Aug. 28, 2008

(51) Int. Cl.
*G01L 21/30* (2006.01)
*H01L 21/00* (2006.01)
*C23F 1/00* (2006.01)
(52) U.S. Cl. .............................. 216/59; 216/58; 216/67; 438/689; 438/706; 438/710; 156/345.29
(58) Field of Classification Search ................... 216/58, 216/67; 438/689, 706, 710
See application file for complete search history.

(56) References Cited

U.S. PATENT DOCUMENTS

| 6,173,673 B1 | 1/2001 | Golovato et al. ............ 118/723 |
| 6,206,972 B1 | 3/2001 | Dunham ..................... 118/715 |
| 6,388,382 B1* | 5/2002 | Doi et al. ............... 315/111.51 |
| 6,589,437 B1* | 7/2003 | Collins ......................... 216/68 |
| 2004/0112540 A1* | 6/2004 | Larson et al. .......... 156/345.33 |
| 2005/0022933 A1* | 2/2005 | Howard ................. 156/345.47 |
| 2005/0082256 A1* | 4/2005 | Honda et al. ................... 216/67 |
| 2005/0178748 A1* | 8/2005 | Buchberger et al. .... 219/121.48 |

(Continued)

FOREIGN PATENT DOCUMENTS

KR   10-2006-0042164   5/2006

OTHER PUBLICATIONS

U.S. Appl. No. 11/693,089, filed Mar. 29, 2007, Paterson et al.

(Continued)

*Primary Examiner*—Shamim Ahmed
(74) *Attorney, Agent, or Firm*—Law Office of Robert M. Wallace

(57) ABSTRACT

A method of processing a workpiece in the chamber of a plasma reactor includes capacitively coupling plasma source power using a ceiling gas distribution plate as the electrode while inductively coupling plasma source power through the ceiling gas distribution plate, and flowing process gas through the gas distribution plate from a gas input to plural gas injection orifices, distributing the gas flow within the gas distribution plate through a succession of arcuate paths joined at respective junctions, dividing gas flow at each junction from a first respective one of said gas flow paths into a respective pair of said gas flow paths in opposite gas flow directions, and restricting the arcuate length of each of the arcuate paths to less than half-circles.

21 Claims, 21 Drawing Sheets

U.S. PATENT DOCUMENTS

2006/0169671 A1* 8/2006 Miya et al. .................. 216/67
2006/0191637 A1* 8/2006 Zajac et al. ............ 156/345.34

OTHER PUBLICATIONS

U.S. Appl. No. 12/004,444, filed Dec. 19, 2007, Bera et al.
U.S. Appl. No. 12/004,472, filed Dec. 19, 2007, Bera et al.
U.S. Appl. No. 12/004,524, filed Dec. 19, 2007, Bera et al.
U.S. Appl. No. 12/004,499, filed Dec. 19, 2007, Bera et al.
U.S. Appl. No. 12/004,448, filed Dec. 19, 2007, Bera et al.

* cited by examiner

US 7,674,394 B2

PLASMA PROCESS FOR INDUCTIVELY COUPLING POWER THROUGH A GAS DISTRIBUTION PLATE WHILE ADJUSTING PLASMA DISTRIBUTION

BACKGROUND OF THE INVENTION

In semiconductor fabrication processes, conventional sources of plasma source power, such as inductively coupled RF power applicators or capacitively coupled RF power applicators, introduce inherent plasma density non-uniformities into the processing. In particular, inductively coupled plasma sources are characterized by an "M"-shaped radial distribution of plasma ion density over the semiconductor workpiece or wafer. As device geometries have continued to shrink, such non-uniformities become more critical, requiring better compensation. Presently, the non-uniformity of an overhead inductively coupled source is reduced or eliminated at the wafer surface by optimizing the coil design and the ceiling-to-wafer distance of the chamber. This distance must be sufficient so that diffusion effects can overcome the effects of the non-uniform ion distribution in the ion generation region before they reach the wafer. Generally, for an inductively coupled plasma source power applicator (e.g., a coil wrapped around the side wall) located near the ceiling, a large ceiling-to-wafer distance is advantageous. However, a large ceiling-to-wafer distance can prevent the beneficial gas distribution effects of a ceiling gas distribution showerhead from reaching the wafer surface, due to diffusion over the large distance. For such large ceiling-to-wafer distances, it has been found that the gas distribution uniformity is not different whether a gas distribution showerhead is employed or a small number of discrete injection nozzles are employed. In summary, the wafer-ceiling gap is optimized for ion density uniformity, which may not necessarily lead to uniform gas distribution.

One limitation of such reactors is that not all process parameters can be independently controlled. For example, in an inductively coupled reactor, in order to increase reaction (etch) rate, the plasma source power must be increased to increase ion density. But, this increases the dissociation in the plasma, which can reduce etch selectivity and increase etch microloading problems, in some cases. Thus, the etch rate must be limited to those cases where etch selectivity or microloading is critical.

Another problem arises in the processing (e.g., etching) of multi-layer structures having different layers of different materials. Each of these layers is best processed (e.g., etched) under different plasma conditions. For example, some of the sub-layers may be best etched in an inductively coupled plasma with high ion density and high dissociation (for low mass highly reactive species in the plasma). Other layers may be best etched in a capacitively coupled plasma (low dissociation, high mass ions and radicals), while yet others may be best etched in plasma conditions which may be between the two extremes of purely inductively or capacitively coupled sources. However, to idealize the processing conditions for each sub-layer of the structure being etched would require different process reactors for each of the different sub-layers, and this is not practical.

Gas distribution is most effectively controlled by injecting the process gas into the reactor chamber through a gas distribution showerhead forming a portion of the ceiling overlying the wafer pedestal. Inductively coupled power distribution across the wafer is most effectively controlled by providing an inductively coupled power applicator (coil antenna) over the ceiling facing the wafer support pedestal. The problem is that if a ceiling gas distribution showerhead is combined with an overhead (ceiling) coil antenna, power from the coil antenna ionizes the process gas inside the showerhead, which degrades process control. Thus, there has seemed no way to combine the overhead gas distribution showerhead with an overhead coil antenna.

SUMMARY OF THE INVENTION

A method of processing a workpiece in the chamber of a plasma reactor having a ceiling overlying the workpiece by introducing a process gas into the chamber through a gas distribution plate in the ceiling. The gas is introduced by distributing gas flow from a first gas input to plural gas distribution orifices extending through a manifold of the gas distribution plate, and distributing gas flow from each of the plural gas distribution orifices to plural gas injection orifices in a showerhead of the gas distribution plate. The method further includes restricting gas flow in the gas distribution plate to paths having arcuate lengths about an axis of symmetry less than a complete circle. The method also includes simultaneously (a) capacitively coupling VHF plasma source power into a process region of the chamber that overlies the wafer from an electrode within the gas distribution plate, and (b) inductively coupling RF plasma source power into the process region from a coil antenna overlying the gas distribution plate. The method further includes adjusting the plasma ion density radial distribution in the process region by adjusting the ratio between the amounts of the capacitively coupled VHF power and the inductively coupled power.

DETAILED DESCRIPTION OF THE INVENTION

Figure 1A:
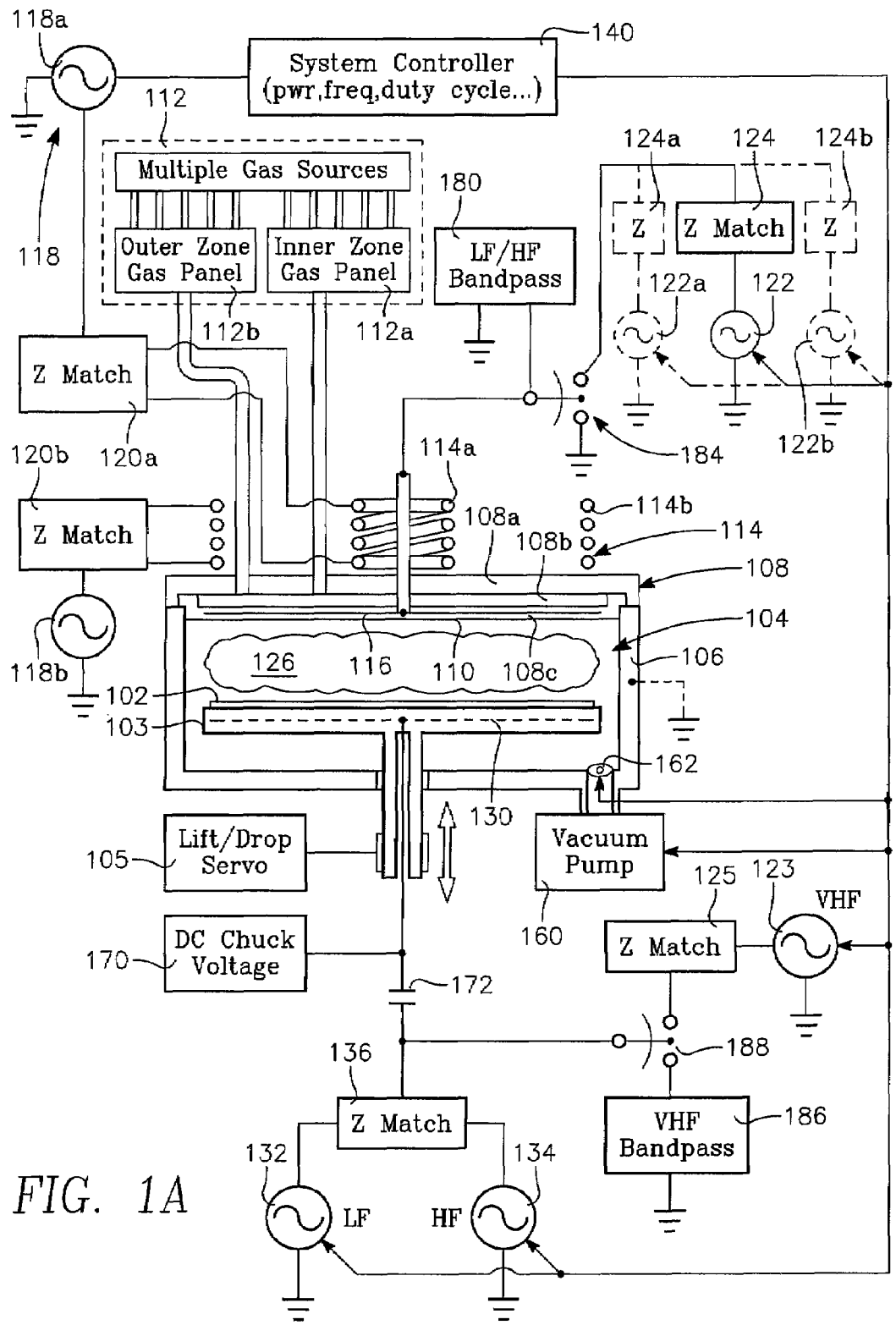
FIG. 1A is a simplified block diagram of a plasma reactor in accordance with an embodiment of the invention.

In the plasma reactor of FIG. 1A, a workpiece 102, which may be a semiconductor wafer, is held on a workpiece support 103 within a reactor chamber 104. Optionally, the workpiece support 103 be raised and lowered by a lift servo 105. The chamber 104 is bounded by a chamber sidewall 106 and a ceiling 108. The ceiling 108 is a gas distribution showerhead assembly including a lid 108a, a manifold 108b and a showerhead 108c having small gas injection orifices 110 extending through it, which are more clearly illustrated in FIG. 5. Referring again to FIG. 1A, the manifold 108b receives process gas from a process gas supply 112. A capacitively coupled RF plasma source power applicator consists of an electrode 116 in the ceiling 108. In order to permit inductive coupling into the chamber 104 from an overhead coil antenna 114, the ceiling 108 is formed of a dielectric material such as a ceramic, and the ceiling electrode 116 has multiple radial slots.

Figure 2:
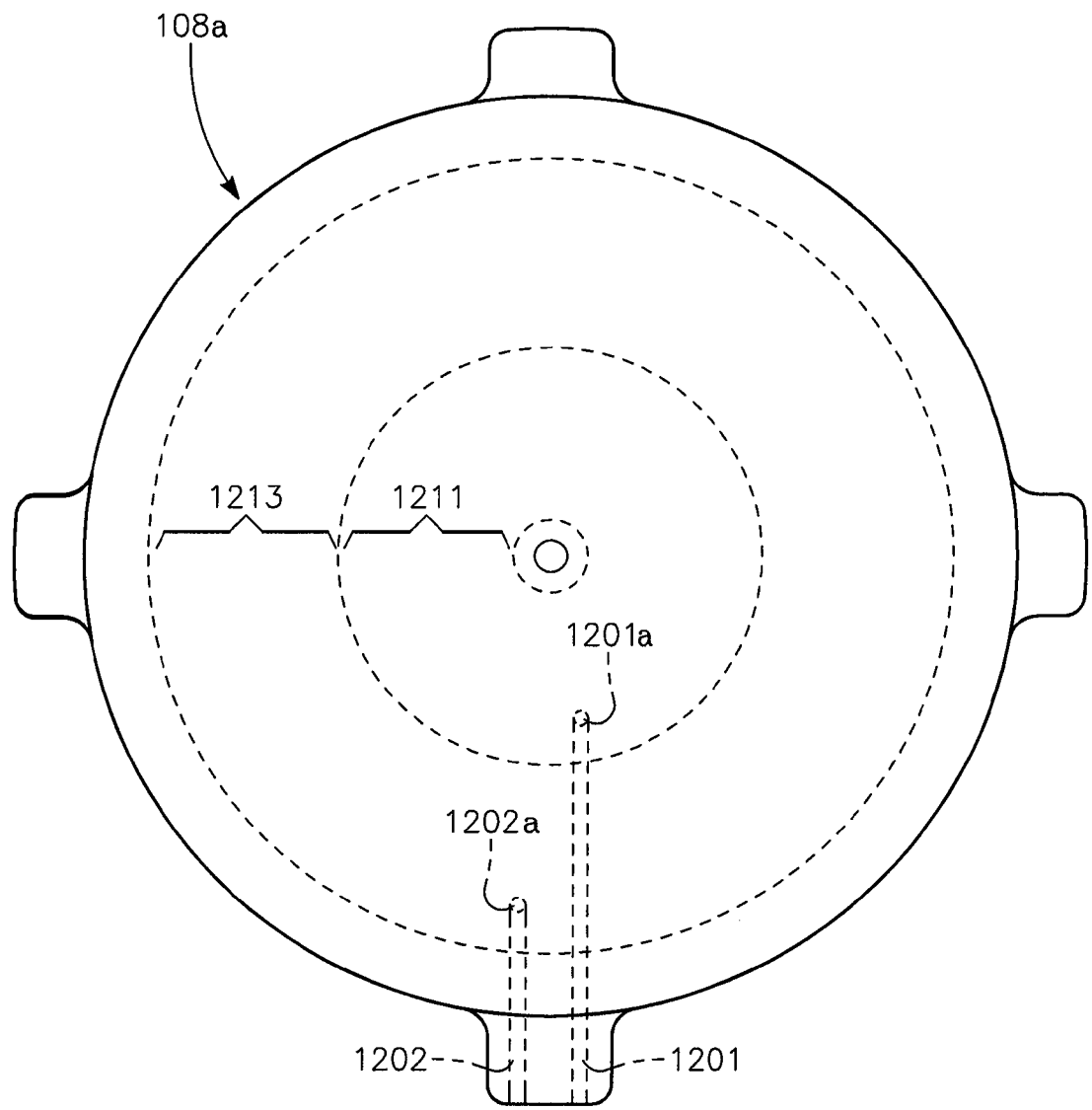
FIG. 2 is a top view of a ceiling lid of the gas distribution plate of the reactor of FIG. 1A.

Prevention of Inductive Coupling into the Gas Injection Showerhead:

The structure of the ceiling or showerhead assembly 108 reduces or prevents coupling of RF power from the coil antenna 114 to process gases inside the showerhead assembly 108. The lid 108a is depicted in FIG. 2, and is a solid ceramic disk having elongate radial inner and outer zone gas supply passages 1201, 1202 extending inwardly from the outer edge of the lid 108a. Inner zone and outer zone gas panels 112a, 112b of the gas supply 112 (FIG. 1A) furnish process gas to respective ones of the gas supply passages 1201, 1202. The gas panels 112a, 112b control process gas flow rates from individual ones of plural (multiple) process gas sources containing different process gas species or compounds.

Figure 3A:
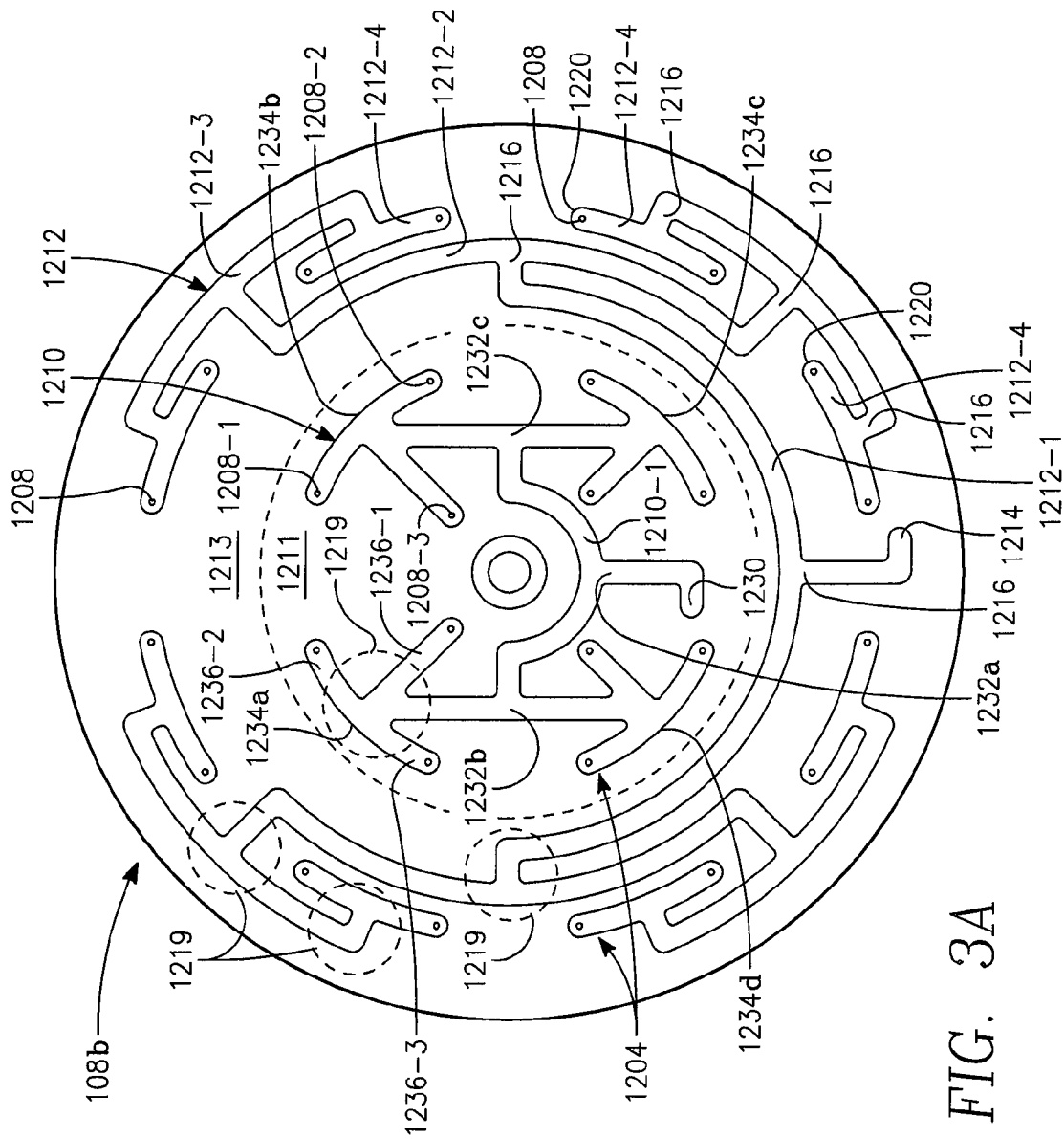
FIG. 3A is a top view of a manifold of the gas distribution plate of the reactor of FIG. 1A.
Figure 3B:
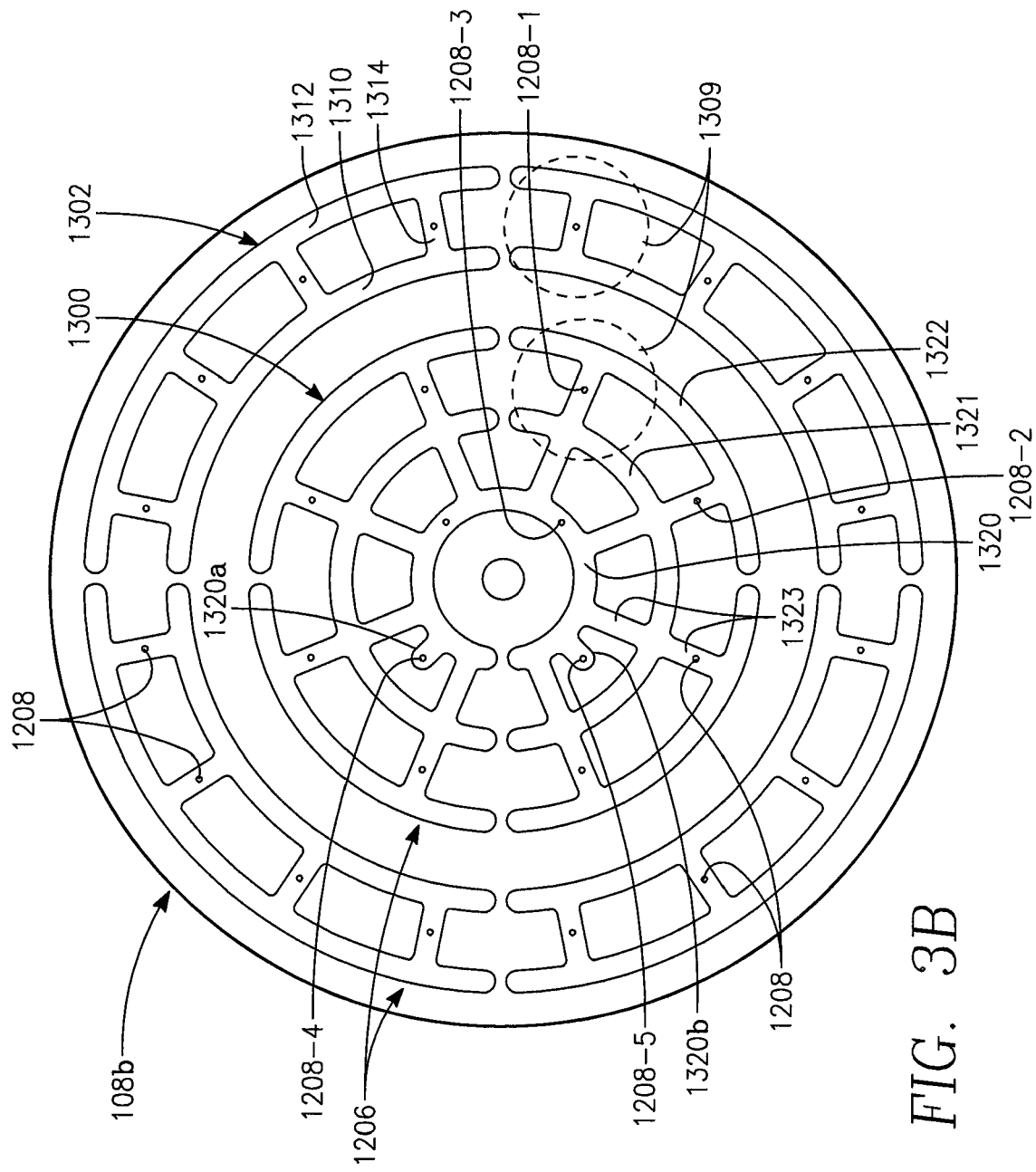
FIG. 3B is a bottom view of a manifold of the gas distribution plate of the reactor of FIG. 1A.

The manifold 108b is a solid ceramic disk depicted in the top and bottom views of FIGS. 3A and 3B, having gas distribution passages formed as channels 1204 in its top surface (FIG. 3A) and channels 1206 in its bottom surface (FIG. 3B). The top surface channels 1204 communicate with the bottom surface channels 1206 through orifices 1208 extending through the manifold 108b. The top surface channels 1204 of FIG. 3A consist of a radially inner group of channels 1210 occupying a circular region or inner zone 1211 and a radially outer group of channels 1212 occupying an annular region or outer zone 1213. The showerhead/ceiling assembly 108 thus divides gas distribution into plural concentric independent gas distribution zones. In the illustrated embodiment, these zones consist of the circular inner zone 1211 (having the inner group of channels 1210) and the annular outer zone 1213 (having the outer group of channels 1212).

The outer channels 1212 begin at a receiving end 1214 that faces an axial port 1202a (shown in FIG. 2) of the gas supply passage 1202 of the lid 108a. Referring again to FIG. 3A, the outer channels 1212 are laid out in multiple T-junctions 1216 in which gas flow is equally divided into opposite circumferential directions at each T-junction 1216. Each T-junction 1216 is at the center of a corresponding T-pattern 1219. The T-junctions 1216 are cascaded so that gas flow is divided among successively shorter arcuate channels 1212-1, 1212-2, 1212-2, 1212-4 in a sequence beginning with the long channels 1212-1 and ending with the short channels 1212-4. The short channels 1212-4 are terminated at tip ends 1220. Each of the orifices 1208 is located at a respective one of the tip ends 1220. Each T-pattern 1219 is symmetrical about the corresponding T-junction 1216 so that the distances traveled through the channels 1212 by gas from the receiving end 1214 to the different orifices 1208 are all the same. This feature ensures uniform gas pressure throughout all the orifices 1208 in the outer gas zone 1213. The gas flow extends less than a complete circle (e.g., less than a half-circle in the embodiment of FIG. 3A) in opposing directions from the input end 1214, so that RF current flow through the gas cannot form a loop. This feature prevents light-up or ionization of the gas in the manifold by suppressing inductive coupling to the gas.

The inner zone channels 1210 of FIG. 3A are likewise arranged in T-patterns. The inner zone channels 1210 begin at a gas receiving end 1230 that underlies an axial port 1201a (shown in FIG. 2) of the supply channel 1202 in the lid 108a. Gas flow is split into two opposing circumferential directions along a concentric channel 1210-1 at a first T-junction 1232a, gas flow in each of those two opposing directions then being split in half at a pair of T-junctions 1232b, 1232c, creating four divided gas flow paths that supply four respective T-patterns 1234a, 1234b, 1234c, 1234d. Each one of the T-patterns 1234 consists of three channels 1236-1, 1236-2, 1236-3 forming the T-pattern. A corresponding one of the orifices 1208 is located within and near the tip end of a corresponding one of the T-pattern channels 1236. The T-patterns at each of the T-junctions 1232, 1234 are symmetrical so that the gas flow distances from the receiving end 1230 to each of the orifices 1208 in the inner zone are the same, in order to ensure uniform gas pressure at the orifices 1208 in the inner zone 1211. The gas flow extends less than a circle (e.g., less than a half-circle in the embodiment of FIG. 3A) in opposing directions from the input end 1230, so that RF current flow through the gas cannot form a loop. This feature prevents light-up or ionization of the gas in the manifold, by preventing or reducing inductive coupling of RF power from the overhead coil antenna 114 to the gases in the manifold 108b.

Referring to the bottom view of the manifold 108b illustrated in FIG. 3B, bottom surface channels 1206 in the bottom surface of the manifold 108b are divided into a circular inner zone 1300 and an annular outer zone 1302 surrounding the inner zone 1300. The channels 1206 in each of the zones 1300, 1302 form successive "H" patterns 1309. In the outer zone 1302, for example, the channels consist of arcuate concentric channels 1310, 1312 and radial channels 1314. Each "H" pattern 1309 is formed by one of the radial channels connecting the concentric channels 1310, 1312. Each of the concentric channels 1310, 1312 extends over a limited arc (e.g., a quarter circle) to prevent inductive coupling of power from the coil 114 to the process gas. The orifices 1208 in the outer zone 1302 are located in the center of each radial channel 1314.

In the inner zone 1300, the bottom surface channels 1206 include sets of arcuate concentric channels 1320, 1321, 1322, each extending less than a complete circle. The innermost circumferential channel 1320 extends around an arc that is nearly (but slightly less than) a complete circle. The next circumferential channel 1321 (of which there are two) extends around an arc of about a half circle. The next circumferential channel 1322 (of which there are four) extends around an arc of about a quarter of a circle. Radial channels 1323 connect the arcuate channels 1320, 1321, 1322. An "H" pattern 1309 is formed by the connection between each radial channel 1323 and the pair of the concentric channels 1321, 1322. Orifices 1208 are located in the radial channels 1323 halfway between the concentric channels 1321, 1322. In addition, some orifices 1208 are located in the innermost concentric channel 1320. In FIG. 3B, the three orifices 1208-1, 1208-2, 1208-3 in the inner zone 1300 are the orifices of the T-pattern 1234b of FIG. 3A.

Referring to the manifold top surface of FIG. 3A, the presence of the half-circular channel 1210-1 intersecting the T-junction 1232a restricts the length of the T-patterns 1234c and 1234d. The result is that, in the manifold bottom surface of FIG. 3B, the inner concentric channel 1320 includes two peninsulas 1320a, 1320b accommodating the orifices 1208-4, 1208-5 slightly outside the central diameter of the channel 1320.

Figure 4:
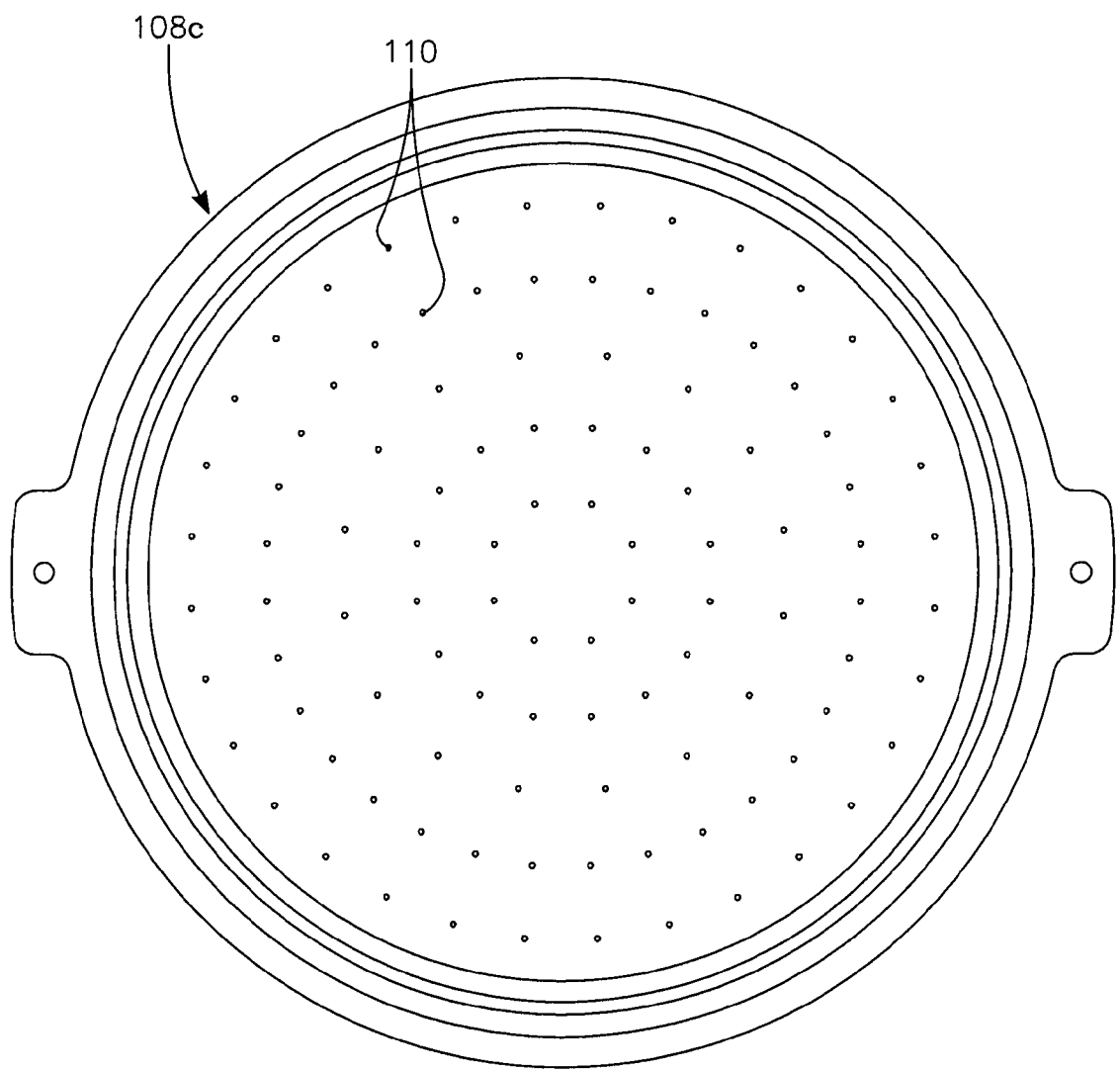
FIG. 4 is a bottom view of a showerhead of the gas distribution plate of the reactor of FIG. 1A.

FIG. 4 depicts the showerhead 108c and the gas injection orifices 110 that extend therethrough. Various ones of the showerhead gas injection orifices 110 are aligned with various ones of the bottom surface channels 1206 of the manifold 108b. Since each of the injection orifices extends completely through the showerhead 108c, their hole patterns on the top and bottom faces of the showerhead 108c are the same.

The purpose of the top surface channels 1204 of the manifold 108b is to uniformly distribute gas pressure from each of the inner and outer zone gas input channels 1201, 1202 to the orifices 1208 without forming any complete circular gas flow paths or loops by which RF power could inductively couple. The purpose of the bottom surface channels 1206 in the manifold 108b is to uniformly distribute gas pressure from orifices 1208 of the manifold 108b to the gas injection orifices 110 of the showerhead 108c while avoiding formation of any complete circular paths of gas in the channels.

Figure 5:
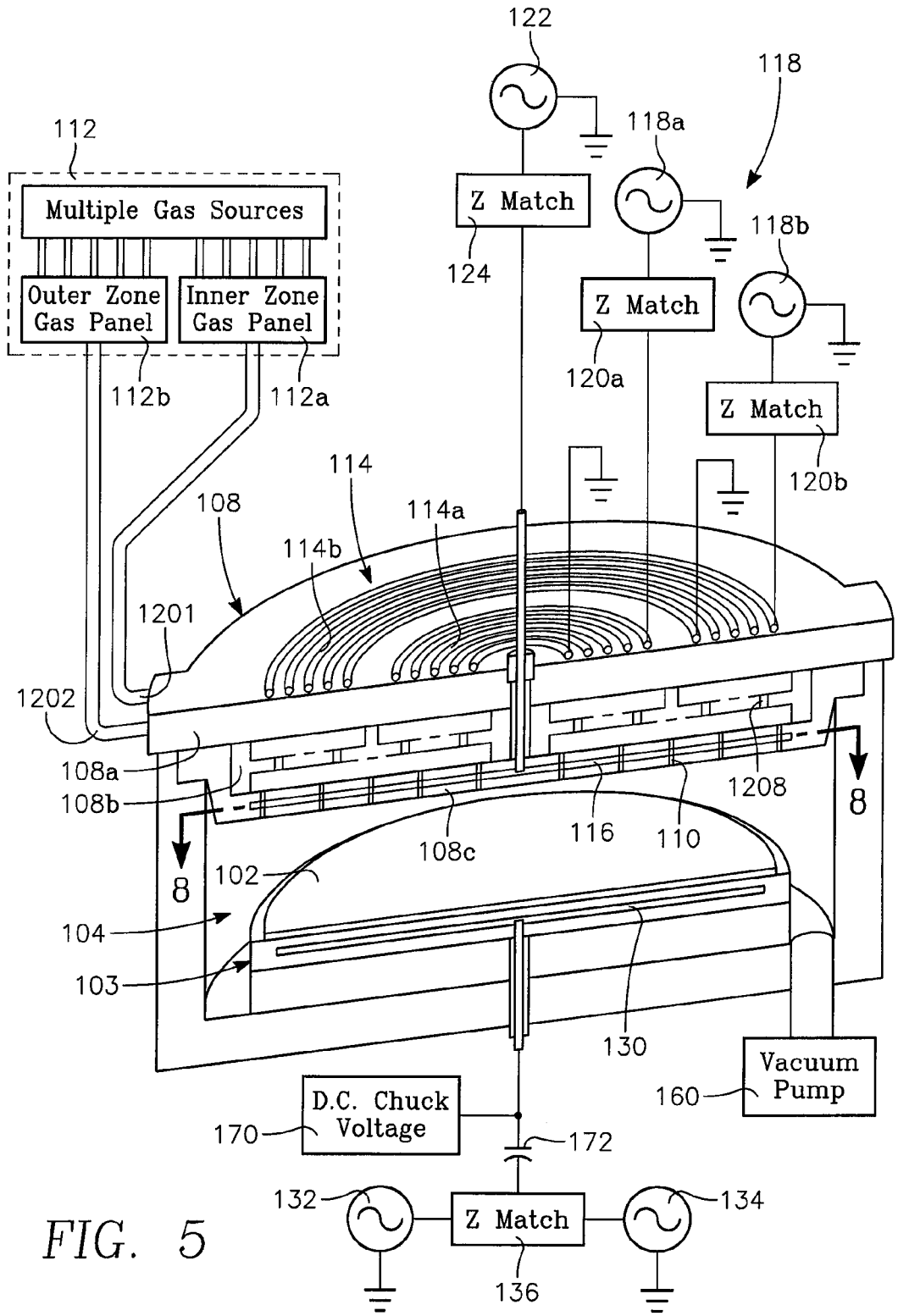
FIG. 5 is a detailed perspective cross-sectional view of the gas distribution plate of the reactor of FIG. 1A.

FIG. 5 is a cross-sectional perspective view of the reactor of FIG. 1A and shows the internal structure of the gas distribution plate assembly 108. Specifically, FIG. 5 shows that the buried electrode 116 is located within the showerhead 108c. Also visible in FIG. 5 are the external connections to the inner and outer gas feed lines 1201, 1202 of the lid 108a of FIG. 2. These lines extend radially from the circumferential edge of the lid 108a as shown in FIG. 5. FIG. 5 also depicts an alternative embodiment of the coil antennas 114a, 114b, in which the coils are flat.

Figure 6:
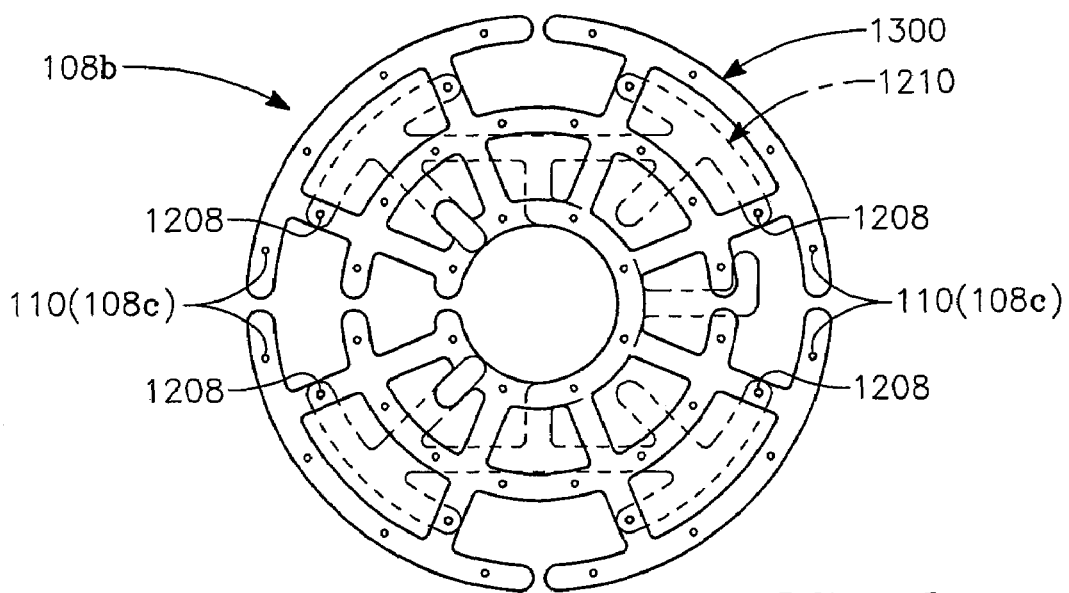
FIG. 6 is a bottom view of the inner zone of the manifold of FIG. 3B and showing the alignment of the gas injection orifices 110 of the showerhead of FIG. 4 relative to the inner zone of the manifold of FIG. 3B.
Figure 7:
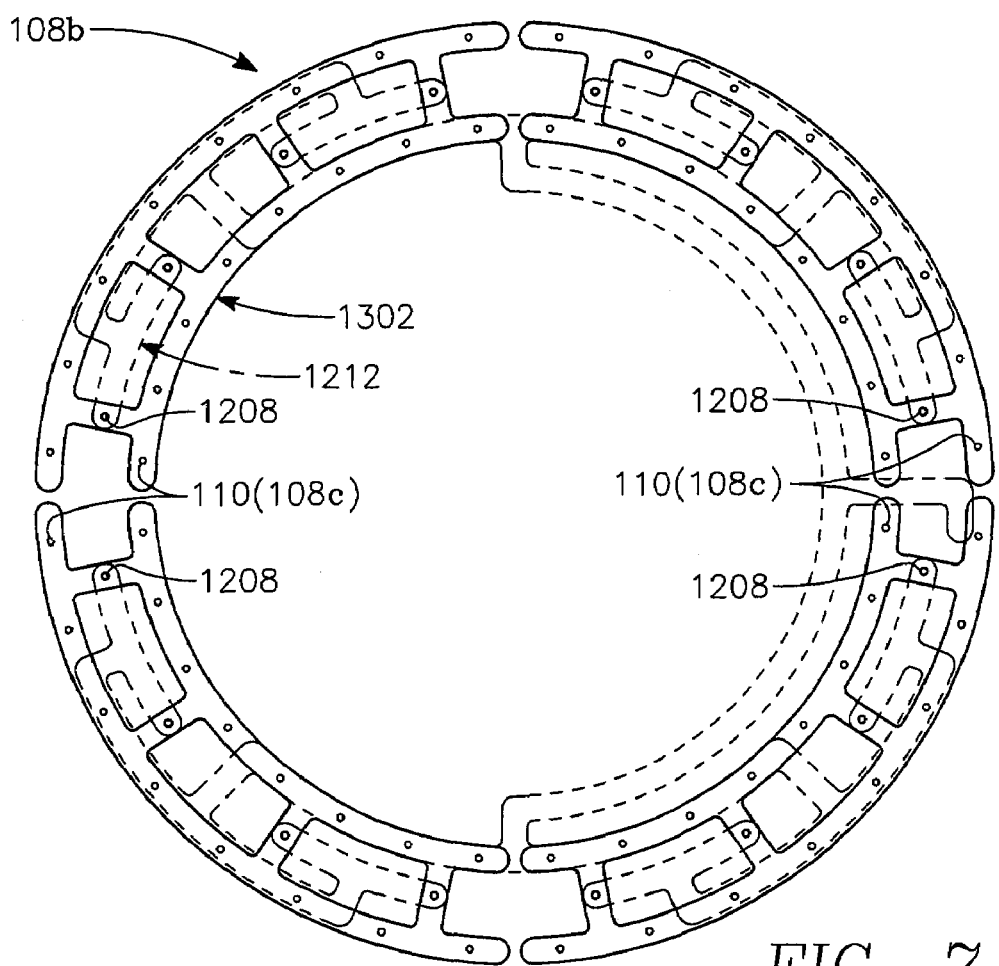
FIG. 7 is a bottom view of the outer zone of the manifold of FIG. 3B and showing the alignment of the gas injection orifices 110 of the showerhead of FIG. 4 relative to the outer zone of the manifold of FIG. 3B.

FIG. 6 depicts the alignment of the showerhead gas injection orifices 110 with the inner zone 1300 of bottom surface channels 1206 of the manifold 108b. FIG. 7 depicts the alignment of the showerhead gas injection orifices 110 with the outer zone 1302 of bottom surface channels 1206 of the manifold 108b. In FIG. 6, the gas flow path from a manifold orifice 1208 to the closest showerhead gas injection orifice 110 is the same for all manifold orifices 1208 of the inner zone 1300. In FIG. 7, the gas flow path from a manifold orifice 1208 to the corresponding showerhead gas injection orifice 110 is the same for all manifold orifices 1208 of the outer zone 1302. This provides a uniform gas pressure at all gas injection orifices 110 of the showerhead 108c within each zone 1300, 1302, while the different zones 1300, 1302 may have different gas pressures.

Figure 8:
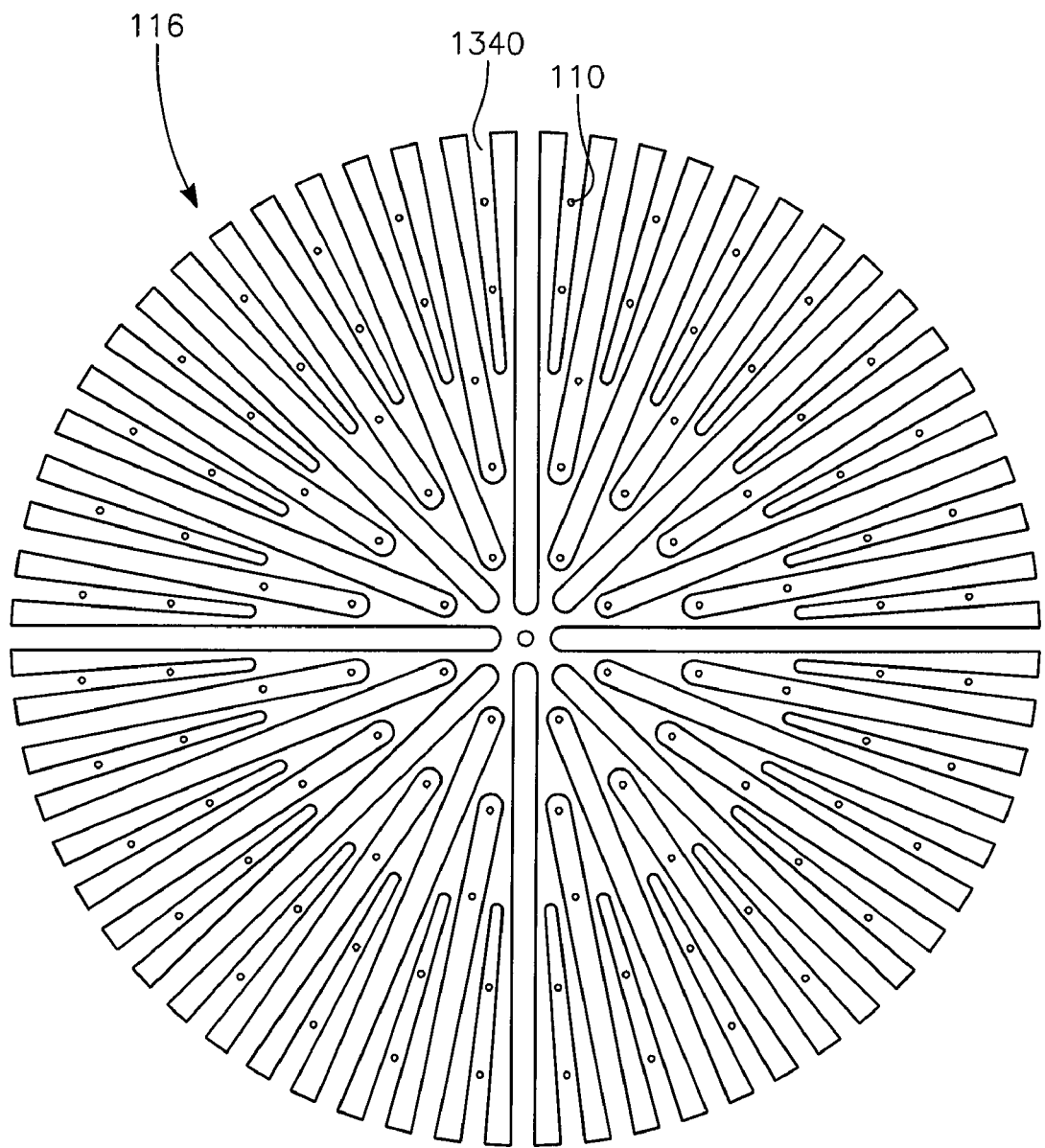
FIG. 8 is a cross-sectional plan view of the showerhead of FIG. 4 taken through lines 8-8 of FIG. 5 of a horizontal plane intersecting a horizontal buried slotted electrode within the showerhead and showing the structure of the buried electrode.

FIG. 8 is a top view of the planar electrode 116 formed inside the ceramic showerhead 108c as a thin conductive layer. The radial slots 1340 in the electrode 116 prevent absorption of inductively coupled power by the electrode, thereby enabling power to be inductively coupled from the coil antenna 114 through the electrode 116 and into the chamber with little or no loss. Optionally, the radial slots 1340 may coincide with the gas injection orifices as depicted in FIG. 8.

Figure 9:
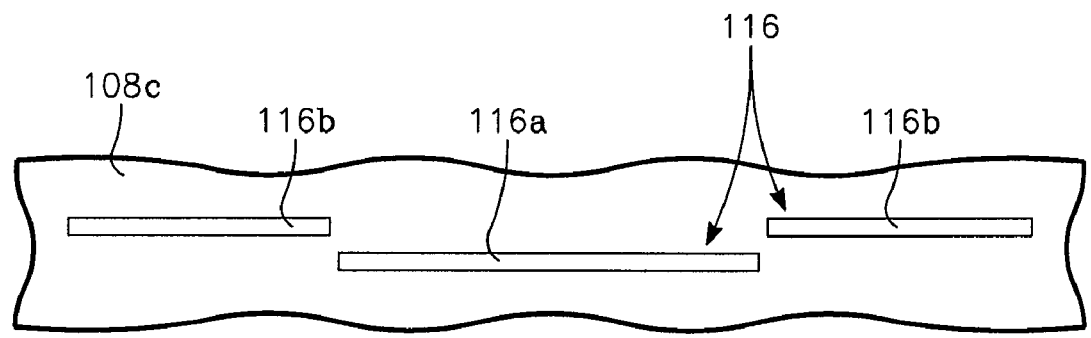
FIG. 9 is a cross-sectional elevational view of the showerhead of FIG. 4 and depicting an alternative embodiment of the buried electrode consisting of separate inner and outer buried electrodes.
Figure 10A:
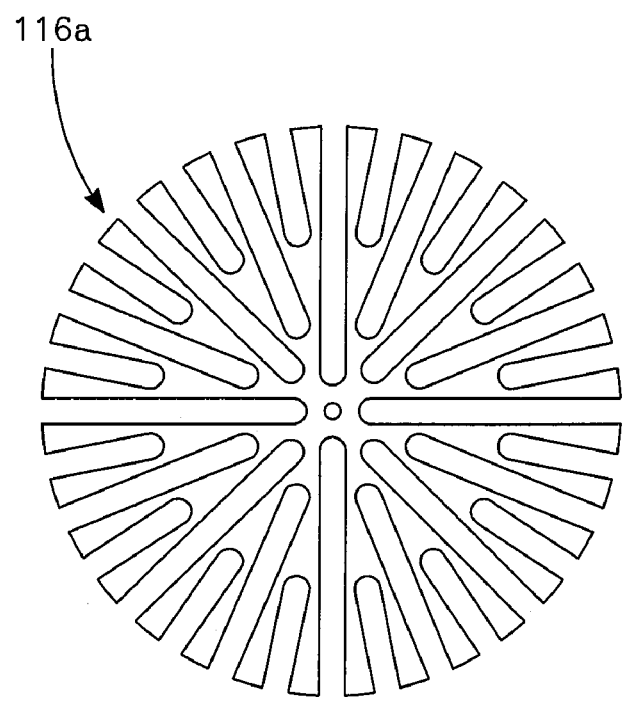
FIG. 10A is a plan view of the inner electrode of FIG. 9.
Figure 10B:
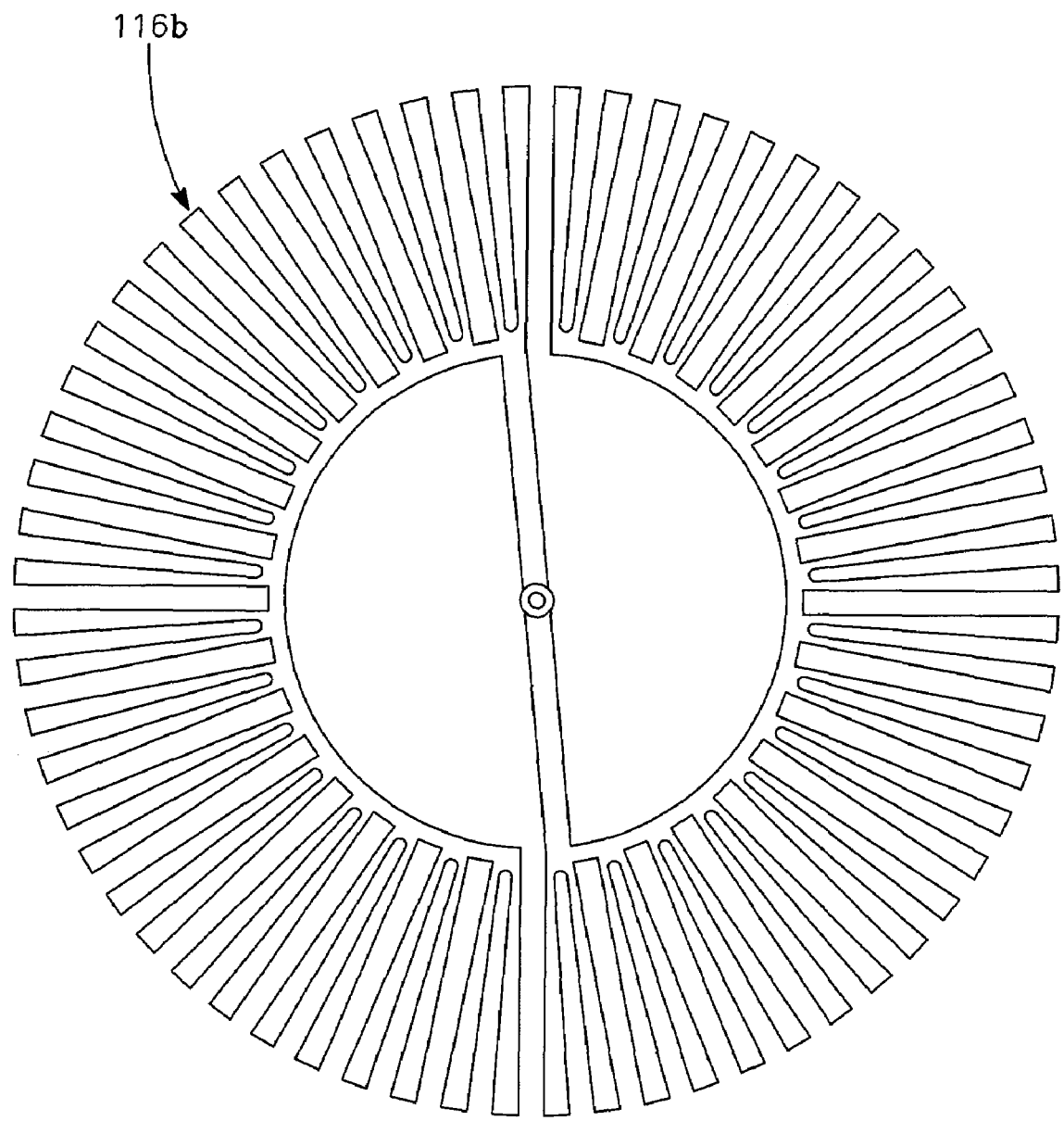
FIG. 10B is a plan view of the outer electrode of FIG. 9.

FIGS. 9, 10A and 10B depict an alternative embodiment of the electrode 116 in which an inner electrode 116a is formed in a circular shape (FIG. 10A) and an outer electrode 116b is formed in an annular shape surrounding the inner electrode. The inner and outer electrodes are formed in different conductive layers inside the ceramic showerhead 108c, as depicted in FIG. 9. Both the inner and outer electrodes are formed with radial slots to prevent blockage by the electrodes 116a, 116b of power from the coil antenna 114.

Multiple Frequency Multi-Mode Reactor:

Referring again to FIG. 1A, the coil antenna 114 is driven by an RF generator 118. The coil antenna may include inner and outer conductor windings 114a, 114b while the generator 118 may be respective RF generators 118a, 118b coupled through respective impedance matches 120a, 120b to the inner and outer coil antennas 114a, 114b. These windings may be either flat helix windings or (as depicted in the drawing) solenoidal.

In an alternative embodiment, RF source power may be capacitively coupled simultaneously from the ceiling electrode 116 and the workpiece support electrode 130. In yet another alternative embodiment, VHF source power is applied to only one of the electrodes 116, 130 while the other serves as an VHF return or counter electrode.

The RF power generator 118 (or the generators 118a, 118b) provides high frequency (HF) power (e.g., within a range of about 10 MHz through 27 MHz). In one embodiment in which the ceiling electrode 116 is the capacitively coupled source power applicator, an RF power generator 122 provides very high frequency (VHF) power (e.g., within a range of about 27 MHz through 200 MHz) through an impedance match element 124 to the capacitively coupled power applicator 116. In another embodiment in which the bottom (workpiece support) electrode 130 is the capacitively coupled source power applicator, an RF power generator 123 provides VHF power through an impedance match element 125 to the bottom electrode 130. In a third embodiment, both the ceiling and bottom electrodes 116, 130 comprise the capacitively coupled plasma source power applicator, so that both VHF generators 122, 123 are present. In a further embodiment, both electrodes 116, 130 are present, but VHF plasma source power is applied to only one them, while the other is coupled to the VHF return potential (e.g., ground) in order to serve as a counterelectrode for the other.

The efficiency of the capacitively coupled power source applicator 116 in generating plasma ions increases as the VHF frequency increases, and the frequency range preferably lies in the VHF region for appreciable capacitive coupling to occur. Power from both RF power applicators 114, 116 is coupled to a bulk plasma 126 within the chamber 104 formed over the workpiece support 103.

RF plasma bias power is coupled to the workpiece 102 from an RF bias power supply coupled to the electrode 130 inside the workpiece support and underlying the wafer 102. The RF bias power supply may include a low frequency (LF) RF power generator 132 (100 kHz to 4 MHz) and another RF power generator 134 that may be a high frequency (HF) RF power generator (4 MHz to 27 MHz). An impedance match element 136 is coupled between the bias power generators 132, 134 and the workpiece support electrode 130. A vacuum pump 160 evacuates process gas from the chamber 104 through a valve 162 which can be used to regulate the evacuation rate. The evacuation rate through the valve 162 and the incoming gas flow rate through the gas distribution showerhead 108c determine the chamber pressure and the process gas residency time in the chamber. If the workpiece support 103 is an electrostatic chuck, then a D.C. chucking voltage supply 170 is connected to the electrode 130. A capacitor 172 isolates the RF generators 123, 132, 134 from the D.C. voltage supply 170.

In the first embodiment, VHF power is applied only to the ceiling electrode 116. In this case, it may desirable for the workpiece support electrode 130 to function as the return path for the VHF power applied to the ceiling electrode 116 and for the ceiling electrode to function as the return path for the HF power applied to the workpiece support electrode 130. For this purpose, the ceiling electrode 116 may be connected through an LF/HF bandpass filter 180 to ground. The bandpass filter 180 prevents VHF from the generator 122 from being diverted from the ceiling electrode 116 to ground. Similarly, the wafer support electrode 130 may be connected (via the RF isolation capacitor 172) to ground through a VHF bandpass filter 186. The VHF bandpass filter 186 prevents LF and HF power from the generators 132, 134 from being diverted from the electrode 130 to ground.

In the second embodiment, VHF power is applied to only the wafer support electrode 130. In this case, the wafer support electrode 130 is not connected to ground, but rather to the VHF generator 123 (via the match 125), so that the VHF bandpass filter 186 is eliminated. Likewise, the LF/HF bandpass filter 180 may be bypassed (or eliminated) and the ceiling electrode 116 connected directly to ground. The foregoing options are indicated symbolically by the switches 184, 188 in FIG. 1A. It is understood that the reactor may be permanently configured in accordance with one of the first or second embodiments rather than being configurable (by the switches 184, 188) into either embodiment, so that only one of the VHF generators 122, 123 would be present, and the switches 184, 188 would be unnecessary in such a case.

In the third embodiment, both electrodes 116, 130 are driven simultaneously by the VHF generators 122, 123 so that neither could be a VHF ground. However, the ceiling electrode 116 could be connected through the LF/HF bandpass filter 180 to ground in order to be a counterelectrode or return for LF/HF bias power applied to the wafer support electrode 130. In this embodiment, the side wall 106 may provide a ground return for the VHF power. If the VHF phase between the two electrodes 130, 116 is different, then each electrode may provide some reference potential for at least a portion of each RF cycle. For example, the VHF phase difference between the two electrodes 116, 130 were 180 degrees, then each electrode 116, 130 would function as a counterelectrode for the other during the entirety of each RF cycle. The two VHF generators 122, 123 may be realized in a single VHF generator. A system controller 140 may govern the difference in phase between the VHF voltages or the VHF currents delivered by the single generator to the respective electrodes 116, 130.

The controller 140 may regulate the source power generators 118, 122 independently of one another in order to control bulk plasma ion density, radial distribution of plasma ion density and dissociation of radicals and ions in the plasma. The controller 140 is capable of independently controlling the output power level of each RF generator 118, 122. In addition, or alternatively, the controller 140 is capable of pulsing the RF output of either one or both of the RF generators 118, 122 and of independently controlling the duty cycle of each, or of controlling the frequency of the VHF generator 122 and, optionally, of the HF generator 118. The controller 140 may also control the pumping rate of the vacuum pump 160 and/or the opening size of the evacuation valve 162. In addition, the controller 140 may control the output power level of each of the bias power generators 132, 134 independently. The controller is operated to carry out the various methods described below.

Figure 1B:
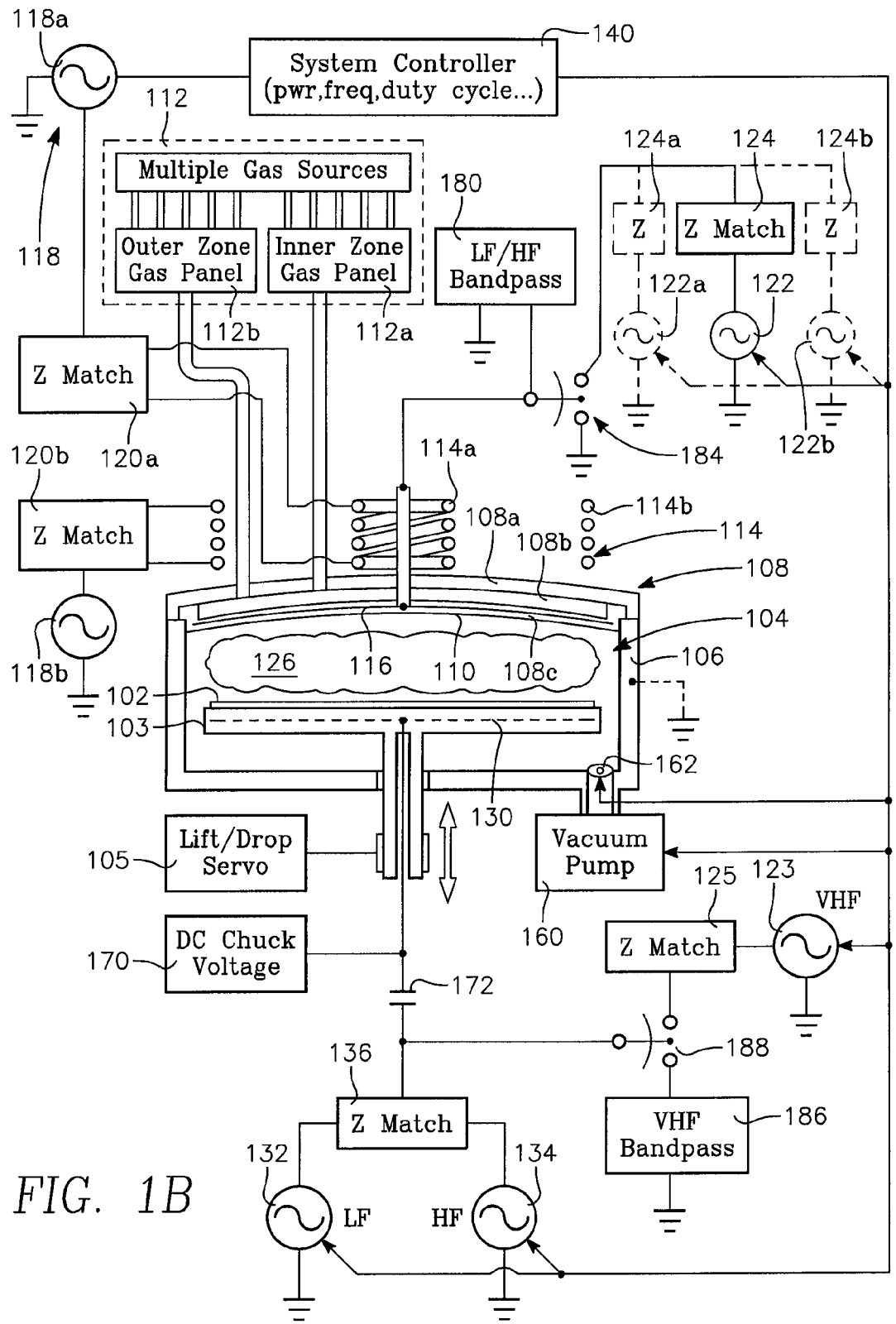
FIG. 1B illustrates a modification of the embodiment of FIG. 1A in which the overhead electrode and showerhead have a dome shape.

FIG. 1B depicts another modification of the embodiment of FIG. 1A in which the gas distribution plate assembly 108 is hemispherical or dome shaped.

Methods of Operating:

The plasma ion density increases as the power applied by either the inductively coupled power applicator 114 or VHF capacitively coupled power applicator 116 is increased. However, they behave differently in that the inductively coupled power promotes more dissociation of ions and radicals in the bulk plasma and a center-low radial ion density distribution. In contrast, the VHF capacitively coupled power promotes less dissociation and a center high radial ion distribution, and furthermore provides greater ion density as its VHF frequency is increased.

The inductively and capacitively coupled power applicators may be used in combination or separately, depending upon process requirements. Generally, when used in combination, the inductively coupled RF power applicator 114 and the capacitively coupled VHF power applicator 116 couple power to the plasma simultaneously, while the LF and HF bias power generators simultaneously provide bias power to the wafer support electrode 130. As will be discussed below, the simultaneous operation of these sources enables independent adjustment of the most important plasma processing parameters, such as plasma ion density, plasma ion radial distribution (uniformity), dissociation or chemical species content of the plasma, sheath ion energy and ion energy distribution (width). For this purpose, the system controller 140 regulates the source power generators 118, 122 independently of one another (e.g., to control their ratio of powers) in order to control bulk plasma ion density, radial distribution of plasma ion density and dissociation of radicals and ions in the plasma, as will be described in a later portion of this specification. The controller 140 is capable of independently controlling the output power level of each RF generator 118, 122. In addition, or alternatively, the controller 140 is capable of pulsing the RF output of either one or both of the RF generators 118, 122 and of independently controlling the duty cycle of each, or of controlling the frequency of the VHF generator 122 and, optionally, of the HF generator 118. In addition, the controller 140 controls the output power level of each of the bias power generators 132, 134 independently in order to control both the ion energy level and the width of the ion energy distribution, as will be described below. The controller 140 is operated to carry out various methods of the invention.

Figure 11A:
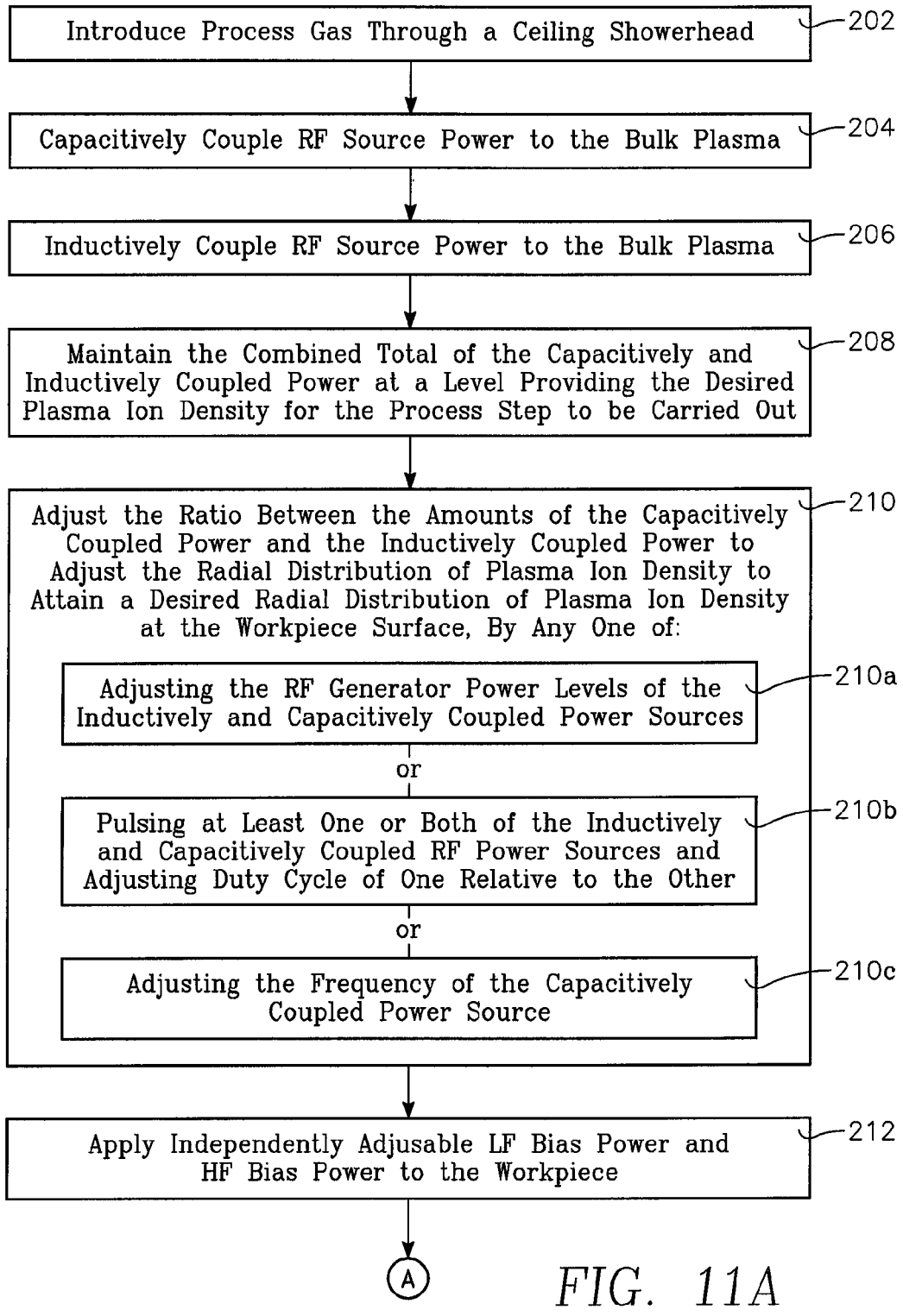
FIGS. 11A and 11B together constitute a block diagram depicting a method of one embodiment of the invention, and these drawings are hereinafter referred to collectively as "FIG. 11".
Figure 11B:
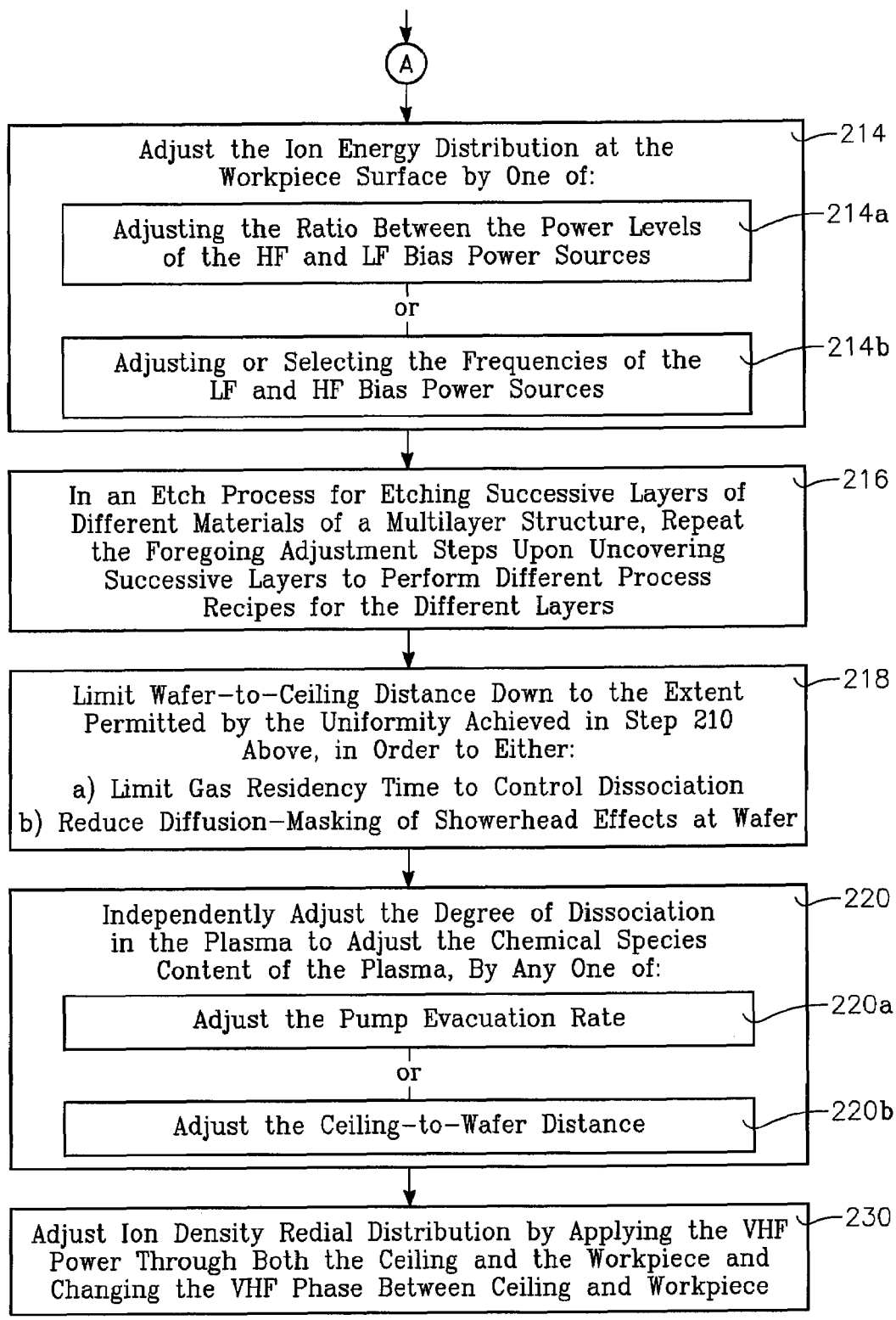

In accordance with a first method of the invention depicted in FIG. 11, plasma ion density, plasma ion density uniformity, sheath ion energy and ion energy distribution (width) are controlled independently of one another. The method of FIG. 11 includes introducing process gas, preferably through the ceiling gas distribution showerhead 108c (block 202 of FIG. 11). The method continues by capacitively coupling VHF source power to the bulk plasma (block 204) while inductively coupling RF source power to the bulk plasma (block 206). The user establishes a certain plasma ion density in accordance with a particular process step. This is accomplished by maintaining the combined total of the VHF capacitively coupled source power and the inductively coupled source power at a level providing the desired plasma ion density for the process step to be carried out (block 208). At the same time, the radial distribution of plasma ion density at the wafer surface is customized (e.g., to make as uniform as possible) while maintaining the desired plasma ion density. This is accomplished by adjusting the ratio between the amounts of the VHF capacitively coupled power and the inductively coupled power (block 210). This apportions the radial ion distribution between the center-low distribution promoted by the inductively coupled power and the center-high distribution promoted by the VHF capacitively coupled power. As will be described below in this specification, this can be accomplished without perturbing the ion density by maintaining the total RF power nearly constant while changing only the ratio between the power delivered by the HF and VHF generators 118, 122.

The adjustment of step 210 can be carried out by any one (or a combination) of the following steps: A first type of adjustment consists of adjusting the RF generator power levels of the inductively and capacitively coupled power sources 118, 122 (block 210a of FIG. 11). Another type consists of pulsing at least one or both of the inductively and capacitively coupled RF power generators 118, 122 and adjusting the duty cycle of one relative to the other (block 210b of FIG. 11). A third type consists of adjusting the effective frequency of the capacitively coupled power VHF generator 122 (block 210c of FIG. 11), in which plasma ion density increases as the VHF frequency is increased. Adjusting the effective VHF frequency of the capacitively coupled plasma source power may be accomplished in a preferred embodiment by providing two VHF generators 122a, 122b of fixed but different VHF frequencies (i.e., an upper VHF frequency $f_1$ output by the generator 122a and a lower VHF frequency $f_2$ output by the generator 122b) whose combined outputs are applied (through impedance matches 124a, 124b) to the capacitive power applicator. Changing the effective VHF frequency $f_{eff}$ within a range bounded by the upper and lower frequencies $f_1$, $f_2$, is performed by varying the ratio between the output power levels $a_1$, $a_2$, of the two generators 122a, 122b. The effective frequency $f_{eff}$ may be approximated to first order as a function of the frequencies $f_1$ and $f_2$ of the two VHF generators 122a, 122b, respectively, and their respective adjustable output power levels, $a_1$ and $a_2$, as follows: $f_{eff}=(a_1 f_1+f_2 a_2)/(a_1+a_2)$. While the foregoing example involves two VHF generators, a larger number may be employed if desired.

The VHF capacitive source can efficiently create plasma density without creating high RF voltages in the plasma, which is similar to an inductively coupled plasma (ICP) source. In contrast, the LF and HF bias sources efficiently create high RF voltages in the plasma but contribute little to plasma density. Therefore, the combination of the VHF source (or VHF sources) and the ICP source allows the plasma to be produced without the side effect of creating large RF voltages within the plasma. As a result, the RF voltage produced by the LF of HF source applied to wafer pedestal can operate independently from the plasma density creating source. The VHF source can be operated independently from the ICP source, with an ability to create plasma density in combination with the ICP (whereas the traditional ICP source employs an HF or LF capacitively coupled power source connected to the wafer pedestal to create RF voltage on the wafer only).

The method further includes coupling independently adjustable LF bias power and HF bias power supplies to the workpiece (block 212). The controller 140 may adjust the ion energy level and ion energy distribution (width or spectrum) at the workpiece surface by simultaneous adjustments of the two RF bias power generators 132, 134 (block 214). This step is carried out by any one of the following: One way is to adjust the ratio between the power levels of the HF and LF bias power sources 132, 134 (block 214a of FIG. 11). Another (less practical) way is adjusting or selecting the frequencies of the LF and HF bias power sources (block 214b of FIG. 11). In a first embodiment, the LF and HF frequencies are applied to the ESC electrode 130 while the VHF source power is applied to the gas distribution showerhead 110 (in which case the showerhead 110 is the CCP applicator 116) while the ICP applicator 114 overlies the showerhead 110. In a second embodiment, the VHF source power is applied to the ESC electrode 130 along with the HF and LF bias frequencies, while the ICP power applicator 114 overlies the showerhead 110.

If the method is used in an etch process for etching successive layers of different materials of a multilayer structure, the plasma processes for etching each of the layers may be customized to be completely different processes. One layer may be etched using highly dissociated ion and radical species while another layer may be etched in a higher density plasma than other layers, for example. Furthermore, if chamber pressure is changed between steps, the effects of such a change upon radial ion density distribution may be compensated in order to maintain a uniform distribution. All this is accomplished by repeating the foregoing adjustment steps upon uncovering successive layers of the multilayer structure (block 216).

The superior uniformity of plasma ion radial distribution achieved in the step of block 210 makes it unnecessary to provide a large chamber volume above the wafer. Therefore, the distance between the wafer and the plasma source may be reduced without compromising uniformity. This may be done when the reactor is constructed, or (preferably) the wafer support 103 may be capable of being lifted or lowered relative to the ceiling 108 to change the ceiling-to-wafer distance. By thus decreasing the chamber volume, the process gas residency time is decreased, providing independent control over dissociation and plasma species content. Also, reducing the ceiling-to-wafer distance permits the gas distribution effects of the gas distribution showerhead 108c to reach the wafer surface before being masked by diffusion, a significant advantage. Thus, another step of the method consists of limiting the ceiling-to-wafer distance to either (a) limit residency time or (b) prevent the showerhead gas distribution pattern from being masked at the wafer surface by diffusion effects (block 218 of FIG. 11). One advantage is that inductive coupling can now be employed without requiring a large ceiling-to-wafer distance to compensate for the center-low ion distribution characteristic of an inductively coupled source. In fact, the ceiling-to-wafer distance can be sufficiently small to enable an overhead gas distribution showerhead to affect or improve process uniformity at the wafer surface.

The chemical species content of the plasma may be adjusted or regulated independently of the foregoing adjustments (e.g., independently of the adjustment of the radial ion density distribution of the step of block 210) by adjusting the degree of dissociation in the plasma, in the step of block 220 of FIG. 11. This step may be carried out by adjusting the rate at which the chamber 104 is evacuated by the vacuum pump 160 (block 220a of FIG. 11), for example by controlling the valve 162, in order to change the process gas residency time in the chamber. (Dissociation increases with increasing residency time and increasing chamber volume.) Alternatively (or additionally), the adjustment of dissociation may be carried out by adjusting the ceiling-to-wafer distance so as to alter the process gas residency time in the chamber (block 220b of FIG. 11). This may be accomplished by raising or lowering the workpiece support 103 of FIG. 1A. The foregoing measures for adjusting dissociation in the plasma do not significantly affect the ratio of inductive and capacitive coupling that was established in the step of block 210 for adjusting ion distribution or uniformity. Thus, the adjustment of the dissociation or chemical species content of step 220 is made substantially independently of the adjustment of plasma ion density distribution of step 210.

In an alternative embodiment, the capacitively coupled source power applicator 116 consists of electrodes in both the ceiling 108 and the workpiece support 103, and VHF power is applied simultaneously through the electrodes in both the ceiling 108 and the workpiece support 103. The advantage of this feature is that the phase of the VHF voltage (or current) at the ceiling may be different from the phase at the workpiece support, and changing this phase difference changes the radial distribution of plasma ion density in the chamber 104. Therefore, an additional step for adjusting the radial distribution of plasma ion density is to adjust the phase difference between the VHF voltage (or current) at the workpiece support 103 and the VHF voltage (or current) at the ceiling 108. This is indicated in block 230 of FIG. 11. This adjustment may or may not require changing the ratio between capacitive and inductive coupling selected in the step of block 210.

Figure 12A:
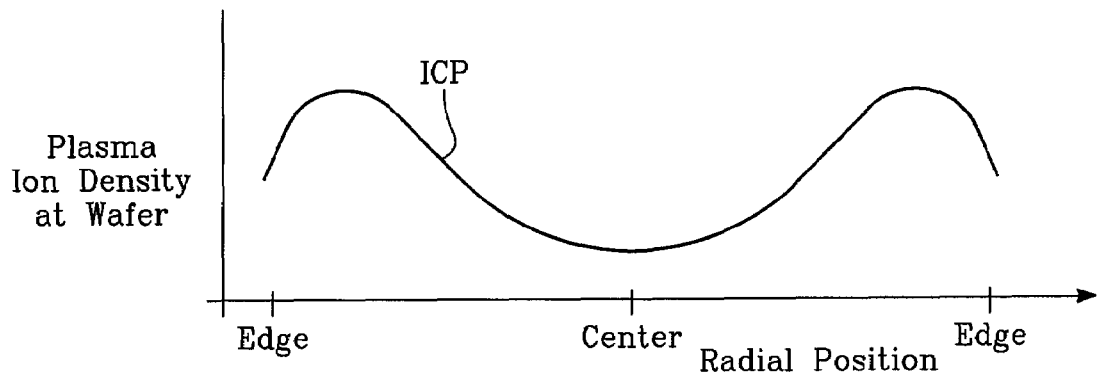
FIG. 12A is a graph depicting a radial distribution of plasma ion density that is typical of an inductively coupled plasma.
Figure 12B:
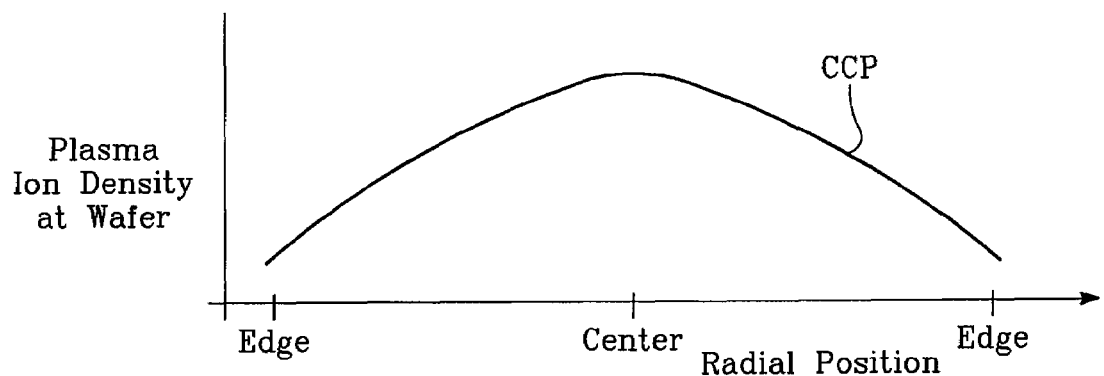
FIG. 12B is a graph depicting the radial distribution of plasma ion density that is typical of a capacitively coupled plasma.
Figure 12C:
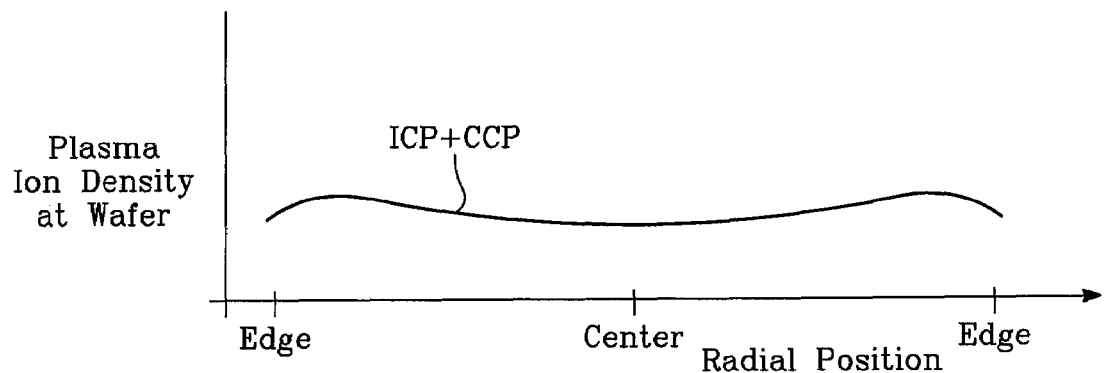
FIG. 12C is a graph depicting the radial distribution of plasma ion density obtained in the reactor of FIG. 1A in accordance with a method of the invention.
Figure 13:
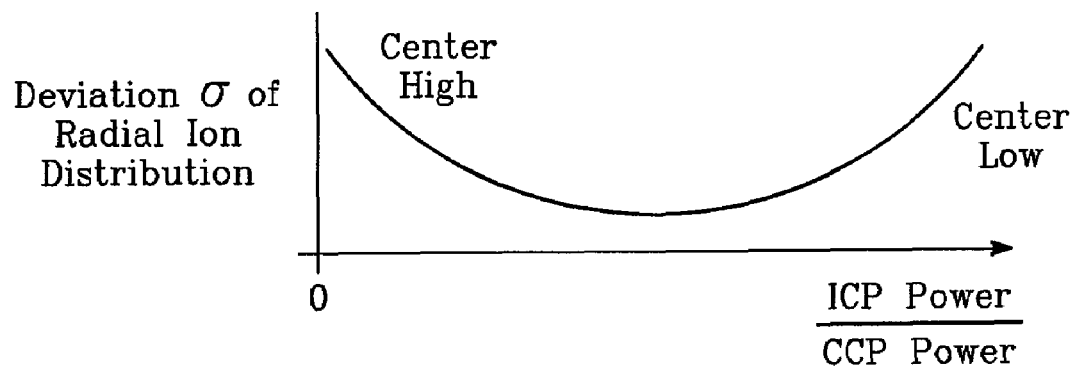
FIG. 13 illustrates ion radial distribution non-uniformity (deviation) as a function of the ratio of the power levels of inductively and capacitively coupled power.
Figure 14:
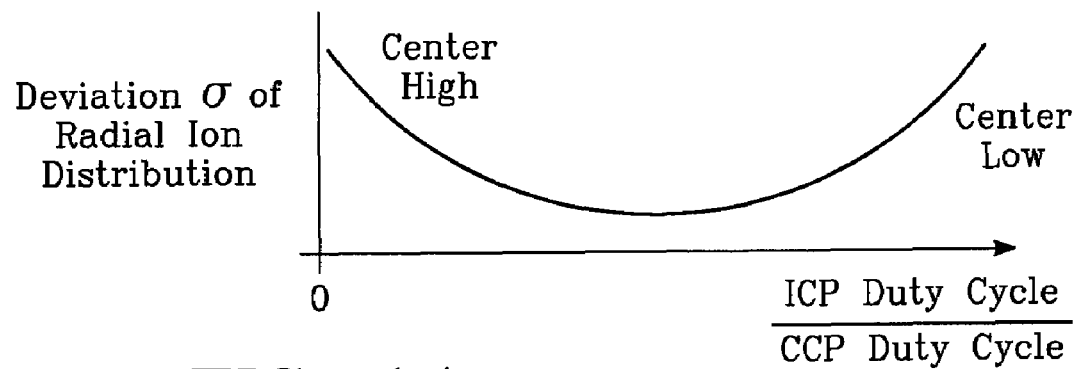
FIG. 14 illustrates ion radial distribution non-uniformity (deviation) as a function of the ratio of the pulse duty cycles of inductively and capacitively coupled power.

FIGS. 12A, 12B and 12C show how the combination of a center-low or "M"-shaped inductively coupled plasma ion density distribution (FIG. 12A) with a center-high capacitively coupled plasma ion density distribution (FIG. 12B) results in a more ideal or more nearly uniform plasma ion density distribution (FIG. 12C) that corresponds to the superposition of the distributions of FIGS. 12A and 12B. The ideal distribution of FIG. 12C is achieved by a careful adjustment of the amount of inductive and capacitive coupling of the two sources 118, 122 of FIG. 1A. A high ratio of capacitively coupled power leads to a more center-high distribution, while a high ratio of inductively coupled power leads to a more center-low distribution. Different ratios will result in the ideal distribution at different chamber pressures. One way of apportioning inductive and capacitive coupling is to apportion the amount of RF power of the generators 118, 122. FIG. 13 depicts how the ratio between the output power levels of the generators 118, 122 affects the radial ion distribution. The minimum or dip in the curve of FIG. 13 corresponds to an ideal power ratio at which the non-uniformity or deviation in ion distribution is the least. Another way of apportioning between inductively and capacitively coupled power is to pulse at least one (or both) of the generators 118, 122, and control the pulse duty cycle. For example, one of them (the inductive source 118) may be pulsed and the other (the capacitive source 122) may be continuous, and the two are balanced by adjusting the duty cycle of the capacitively couple source 122. Alternatively, both may be pulsed, and apportioning is done by controlling the ratio of the duty cycles of the two sources. The results are depicted in FIG. 14, in which a high ratio of inductively coupled-to-capacitively coupled duty cycles results in more inductively coupled power reaching the plasma and a more center-low distribution. A high ratio of capacitively coupled power-to-inductively coupled power results in more capacitively coupled power in the plasma, providing a center-high distribution.

Figure 15:
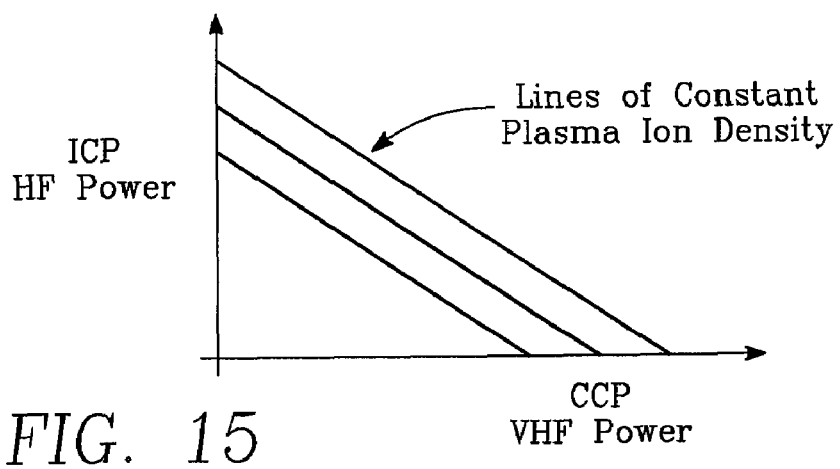
FIG. 15 is a graph illustrating lines of constant plasma ion density for pairs of values of inductively and capacitively coupled power levels.
Figure 16:
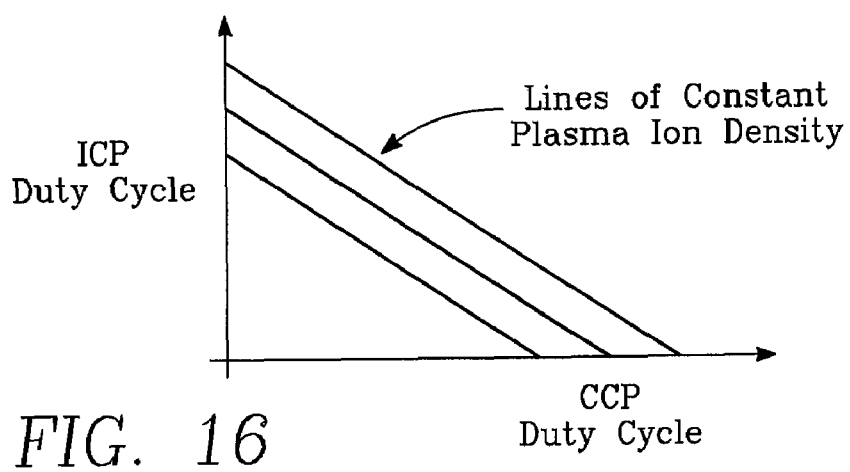
FIG. 16 is a graph illustrating lines of constant plasma ion density for pairs of values of inductively and capacitively coupled power pulsed duty cycles.

The foregoing adjustments to the ion density distribution can be carried out without changing plasma ion density. FIG. 15 illustrates how this is accomplished in the embodiment of FIG. 1A in which uniformity adjustments are made by adjusting RF generator output power. FIG. 15 depicts lines of constant ion density for different combinations of inductively coupled power (vertical axis) and capacitively coupled power (horizontal axis). Provided that the values of inductively and capacitively coupled power from the generators 118, 122 respectively are constrained to lie along a particular one of the lines of constant density, the inductive-capacitive power ratio may be set to any desired value (in order to control uniformity) without changing the plasma ion density. The lines of constant density are deduced for any given reactor by conventional testing. FIG. 16 illustrates how this is accomplished in the embodiment of FIG. 14 in which uniformity adjustments are made by adjusting RF generator pulsed duty cycle. FIG. 16 depicts lines of constant ion density for different combinations of inductively coupled duty cycle (vertical axis) and capacitively coupled duty cycle (horizontal axis). Provided that the values of inductively and capacitively coupled duty cycles from the generators 118, 122 respectively are constrained to lie along a particular one of the lines of constant density, the inductive-capacitive power ratio may be set to any desired value (in order to control uniformity) without changing the plasma ion density. The lines of constant density are deduced for any given reactor by conventional testing.

Figure 17:
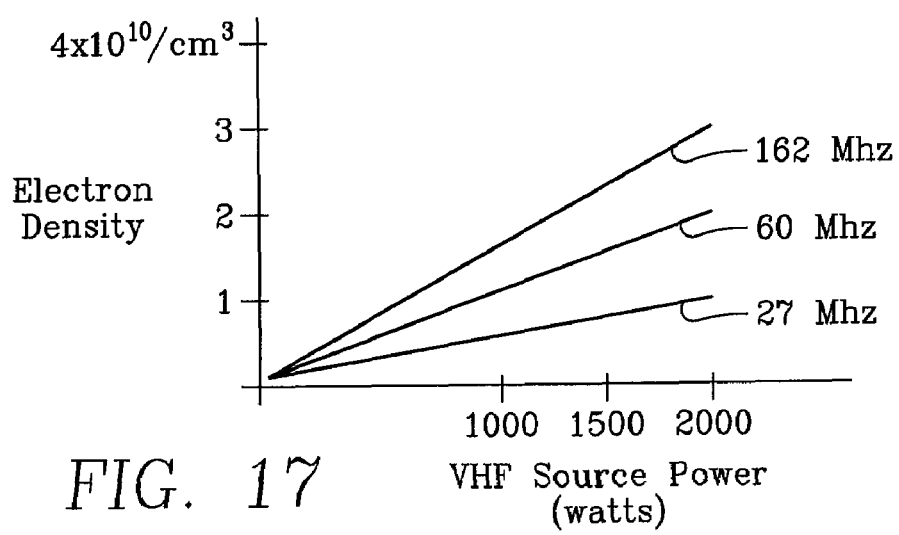
FIG. 17 is a graph illustrating the dependency of electron density in the bulk plasma as a function of source power levels for different VHF frequencies of the capacitively coupled power.

FIG. 17 is a graph depicting the effect of the selection of the frequency of the VHF capacitively coupled power source 122 upon ion density, in the step of block 210c of FIG. 11. FIG. 17 shows that ion density (and hence power coupling) increases with applied source power at a greater rate as the frequency is increased (e.g., from 27 MHz, to 60 MHz and then to 200 MHz). Thus, one way of affecting plasma ion density and the balance between capacitive and inductively coupled power is to select or control the VHF frequency of the capacitively coupled source RF generator 122.

Figure 18A:
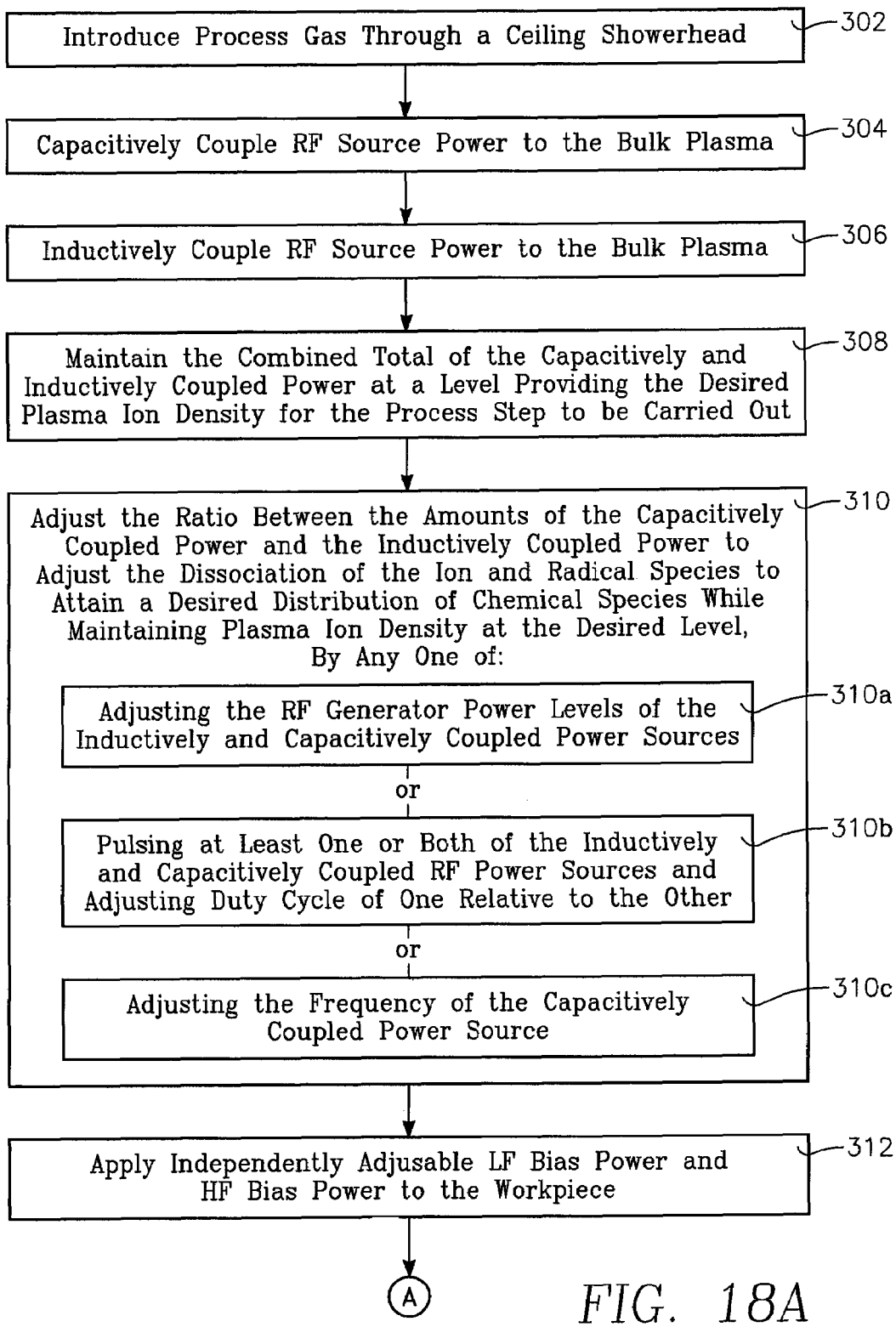
FIGS. 18A and 18B together constitute a block diagram depicting a method of another embodiment of the invention, and are hereinafter referred to collectively as "FIG. 18".
Figure 18B:
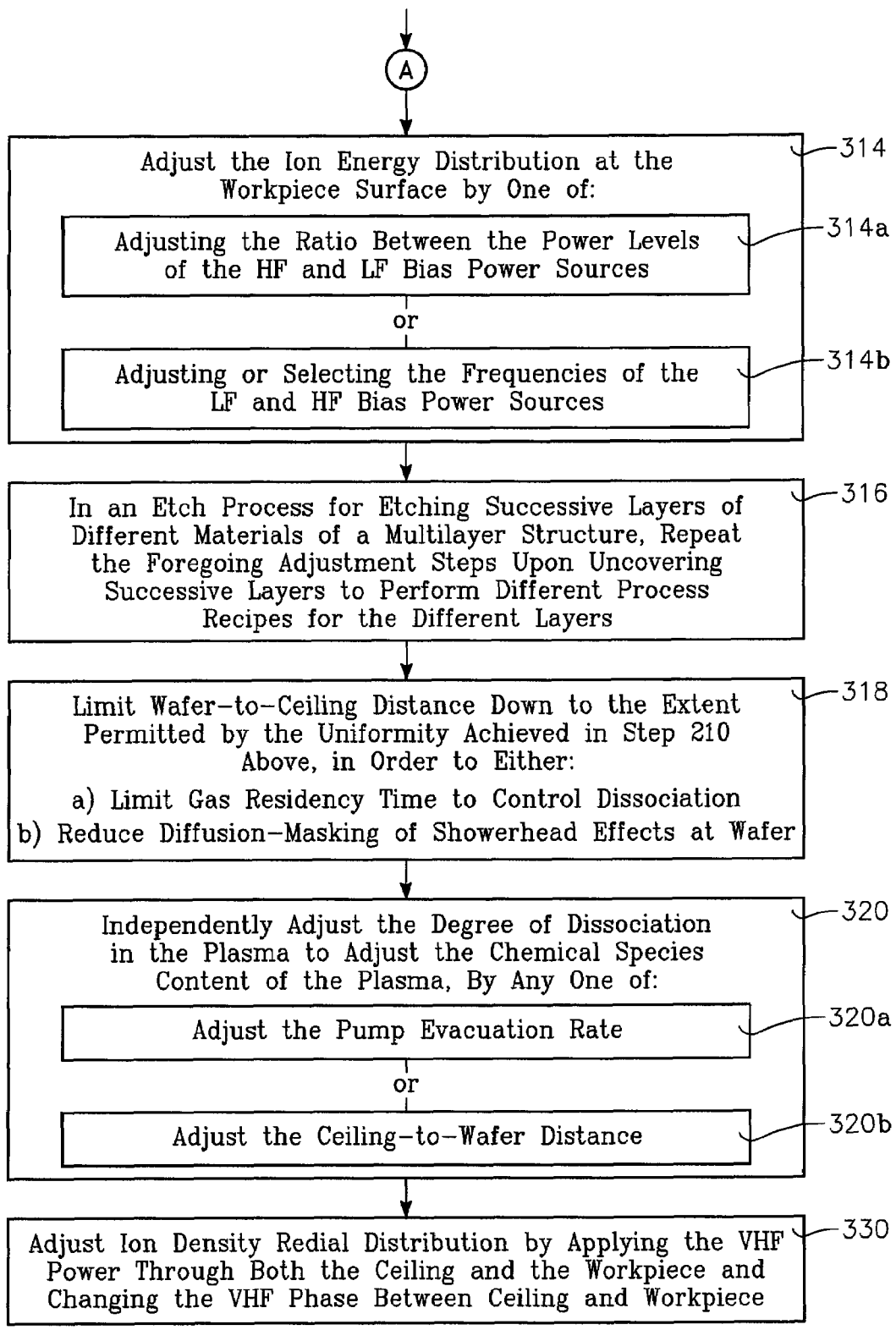

FIG. 18 depicts a modification of the method of FIG. 11 in which a desired plasma ion density is maintained while the inductive-to-capacitive coupling ratio discussed above is employed to achieve a desired level of dissociation or chemical species content of the plasma. The method of FIG. 18 includes introducing process gas, preferably through the ceiling gas distribution showerhead 108c (block 302 of FIG. 18). The method continues by capacitively coupling RF source power to the bulk plasma (block 304) while inductively coupling RF source power to the bulk plasma (block 306). The user establishes a certain plasma ion density in accordance with a particular process step. This is accomplished by maintaining the combined total of the capacitively coupled power and the inductively coupled power at a level providing the desired plasma ion density for the process step to be carried out (block 308). At the same time, the degree of dissociation in the bulk plasma is determined (e.g., to satisfy a certain process requirement) while maintaining the desired plasma ion density. This is accomplished by adjusting the ratio between the amounts of the VHF capacitively coupled power and the inductively coupled power (block 310). This fixes the dissociation (kinetic electron energy in the bulk plasma) between a very high level characteristic of an inductively coupled plasma and a lower level characteristic of a VHF capacitively coupled plasma. Such apportionment can be accomplished without perturbing the ion density by maintaining the total RF power nearly constant while changing only the ratio between the power delivered by the HF and VHF generators 118, 122, in accordance with the methods described above with reference to FIG. 15 and (or) FIG. 16.

The adjustment of step 310 can be carried out by any one (or a combination) of the following step: A first type of adjustment consists of adjusting the RF generator power levels of the inductively and capacitively coupled power sources 118, 122 (block 310a of FIG. 18). Another type consists of pulsing at least one or both of the inductively and capacitively coupled RF power generators 118, 122 and adjusting the duty cycle of one relative to the other (block 310b of FIG. 18). A third type consists of adjusting the effective frequency of the capacitively coupled power VHF generator 122 (block 310c of FIG. 18), in which plasma ion density increases as the VHF frequency is increased. Changing the effective VHF frequency can be carried out by providing a pair of fixed frequency VHF generators 122a, 122b having respective frequencies and adjusting the ratio between their output power levels.

The method further includes coupling independently adjustable LF bias power and HF bias power supplies to the workpiece (block 312). The controller 140 adjusts the ion energy level and ion energy distribution (width or spectrum) at the workpiece surface by simultaneous adjustments of the two RF bias power generators 132, 134 (block 314). This step is carried out by any one of the following: One way is to adjust the ratio between the power levels of the HF and LF bias power sources 132, 134 (block 314a of FIG. 18). Another way is to adjusting or selecting the frequencies of the LF and HF bias power sources (block 314b of FIG. 18).

The method is useful for performing plasma enhanced etch processes, plasma enhanced chemical vapor deposition (PECVD) processes, physical vapor deposition processes and mask processes. If the method is used in an etch process for etching successive layers of different materials of a multilayer structure, the plasma processes for etching each of the layers may be customized to be completely different processes. One layer may be etched using highly dissociated ion and radical species while another layer may be etched in a higher density plasma than other layers, for example. Furthermore, if chamber pressure is changed between steps, the effects of such a change upon radial ion density distribution may be compensated in order to maintain a uniform distribution. All this is accomplished by repeating the foregoing adjustment steps upon uncovering successive layers of the multilayer structure (block 316).

The superior uniformity of plasma ion radial distribution achieved by combining inductively coupled source power and VHF capacitively coupled source power makes it unnecessary to provide a large ceiling-to-wafer distance. Therefore, the ceiling-to-wafer distance may be reduced without compromising uniformity. This may be done when the reactor is constructed, or (preferably) the wafer support 103 may be capable of being lifted or lowered relative to the ceiling 108 to change the ceiling-to-wafer distance. By thus decreasing the chamber volume, the process gas residency time is decreased, providing independent control over dissociation and plasma species content. Also, reducing the ceiling-to-wafer distance permits the gas distribution effects of the gas distribution plate assembly 108 to reach the wafer surface before being masked by diffusion, a significant advantage. Thus, another step of the method consists of limiting the ceiling-to-wafer distance to either (a) limit residency time or (b) prevent the showerhead gas distribution pattern from being masked at the wafer surface by diffusion effects (block 318 of FIG. 18).

The chemical species content of the plasma may be adjusted or regulated independently of the foregoing adjustments by adjusting the process gas residency time in the chamber, in the step of block 320 of FIG. 18. This step may be carried out by adjusting the rate at which the chamber 104 is evacuated by the vacuum pump 160 (block 320a of FIG. 18), for example by controlling the valve 162, in order to change the process gas residency time in the chamber. (Dissociation increases with increasing residency time.) Alternatively (or additionally), the adjustment of dissociation may be carried out by adjusting the ceiling-to-wafer distance so as to alter the process gas residency time in the chamber (block 320b of FIG. 18). This may be accomplished by raising or lowering the workpiece support 103 of FIG. 1A. The foregoing measures for adjusting dissociation in the plasma do not significantly affect the ratio of inductive and capacitive coupling that was established in the step of block 310. Thus, the adjustment of the dissociation or chemical species content of step 320 is made substantially independently of (or in addition to) the adjustment of dissociation of step 210.

In an alternative embodiment, the capacitively coupled source power applicator 116 consists of electrodes in both the ceiling 108 and the workpiece support 103, and VHF power is applied simultaneously through the electrodes in both the ceiling 108 and the workpiece support 103. The advantage of this feature is that the phase of the VHF voltage (or current) at the ceiling may be different from the phase at the workpiece support, and changing this phase different changes the radial distribution of plasma ion density in the chamber 104. Therefore, the radial distribution of plasma ion density may be adjusted independently of the dissociation (i.e., without changing the capacitive-to-inductive coupling ratio selected in the step of block 310) by adjusting the phase difference between the VHF voltage (or current) at the workpiece support 103 and the VHF voltage (or current) at the ceiling 108. This is indicated in block 330 of FIG. 18.

Figure 19:
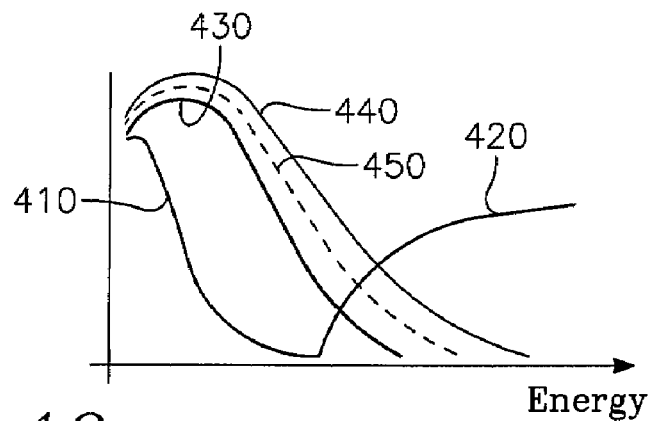
FIG. 19 is a graph illustrating different bulk plasma electron energy distribution functions obtained for different mixtures of capacitively and inductively coupled power.

FIG. 19 is a graph depicting how the ratioing of inductive and capacitive coupling controls dissociation in the bulk plasma in the step of block 308. Dissociation is promoted by an increase in electron energy within the bulk plasma, and FIG. 19 depicts the electron energy distribution function for four different operating regimes.

The curve labeled 410 depicts the electron energy distribution function in the case in which only the HF bias power is applied to the wafer and no source power is applied. In this case, the electron population is confined within a low energy spectrum, well below an energy at which the cross-section for a typical dissociation reaction (represented by the curve 420) has an appreciable magnitude. Therefore, less (if any) dissociation occurs.

The curve labeled 430 depicts the electron energy distribution function in the case in which VHF power is applied to the capacitively coupled source power applicator 116 and no power is applied to any other applicator. In this case, the electron population has a small component coinciding with the collision cross-section 420 and so a small amount of dissociation occurs.

The curve labeled 440 depicts the electron energy distribution function in the case in which HF power is applied to the inductively coupled source power applicator 114 and power is applied to no other applicator. In this case, the electron population has a component coinciding with a high value of the collision cross-section 420, and therefore a very high degree of dissociation occurs in the bulk plasma.

Figure 20:
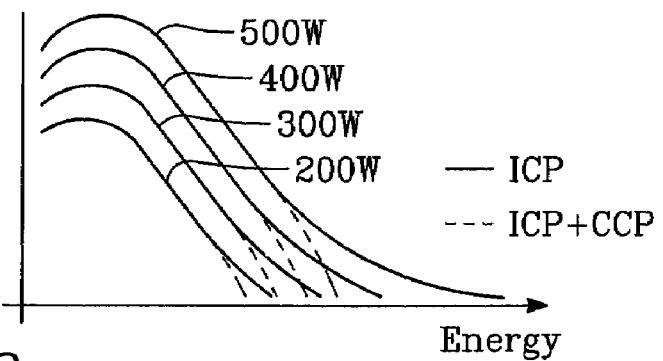
FIG. 20 depicts the change in electron energy distribution functions for different source power levels obtained when capacitively coupled power is added to inductively coupled power.

The curve labeled 450 depicts the electron energy distribution function for a case in which RF power is apportioned between the capacitive and inductively coupled applicators 116, 114. In this case, the resulting electron energy distribution function is mixture of the two functions 430, 440 and lies between them, so that a lesser amount of ion dissociation occurs in the bulk plasma. The curve 450 representing the combined case has a somewhat smaller electron population at or above an energy at which the collision cross-section 420 has a significant magnitude, leading to the lesser degree of dissociation. The combination case curve 450 can be shifted toward greater or lesser energy levels by changing the ratio between the amounts of capacitive and inductive coupled power. This is depicted in the graph of FIG. 20 in which each solid line curve corresponds to the electron energy distribution function for purely inductively coupled power at a particular power level. The dashed line curves extending from the solid line curves depict the modification of those curves as more power is diverted away from inductive coupling and applied to capacitive coupling. Essentially, this causes the electron population to shift to lower energy levels, thereby decreasing dissociation.

Figure 21:
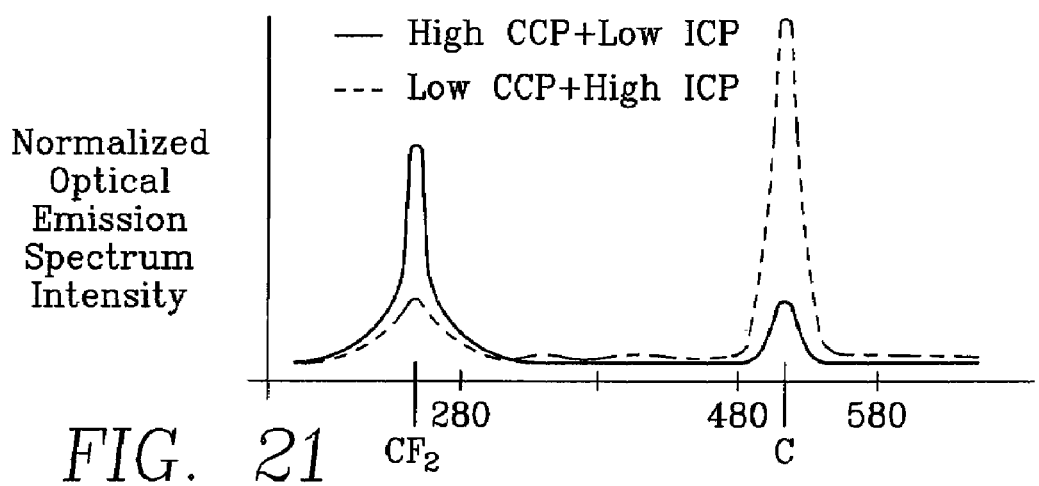
FIG. 21 depicts different optical emission spectra obtained for different degrees of dissociation (electron energy distributions).

FIG. 21 illustrates the effects of different levels of dissociation upon the chemical content of the plasma. The vertical axis represents the optical emission spectrum intensity and the horizontal axis represents wavelength. Different peaks correspond to the presence of certain radicals or ions, and the magnitude of the peak corresponds to the population or incidence in the plasma of the particular species. The solid line curve corresponds to a low degree of dissociation (capacitive coupling predominant), in which larger molecular species are present in large numbers. The dashed line curve corresponds to a high degree of dissociation (inductive coupling predominant), in which smaller (more reactive) chemical species are present in large numbers (depending upon the parent molecule). In the example illustrated in FIG. 21, a large molecular-weight species with high incidence in the predominantly capacitively coupled regime is CF2, while a low molecular-weight species with high incidence in the predominantly inductively coupled regime is free carbon C. In some cases, the presence of C (free carbon) is an indicator of the presence of very light and highly reactive species, such as free fluorine, which may be desirable where a high etch rate is desired. The presence of the larger species such as CF2 is an indicator of less dissociation and an absence of the more reactive species, which may be desirable in a plasma etch process requiring high etch selectivity, for example.

Figure 22:
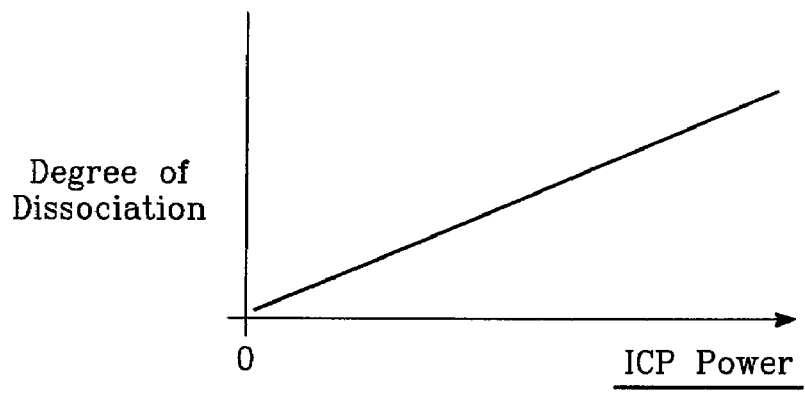
FIG. 22 is a graph depicting how the degree of dissociation (e.g., population of free carbon or free fluorine) increases with increasing ratio of inductively coupled power to capacitively coupled power.

FIG. 22 is a graph illustrating one way of carrying out the step of block 310*a* of FIG. 18. The vertical axis of FIG. 22 corresponds to the degree of dissociation in the bulk plasma, and may represent the optical emission spectrum intensity of a highly dissociated species such as free carbon in FIG. 21. The horizontal axis is the ratio of inductively coupled plasma (ICP) power to capacitively coupled plasma (CCP) power (the power levels of the ICP and CCP generators 118, 122 of FIG. 1A). FIG. 22 indicates that the dissociation is a generally increasing function of this ratio, although it may not be the simple linear function depicted in FIG. 22.

Figure 23:
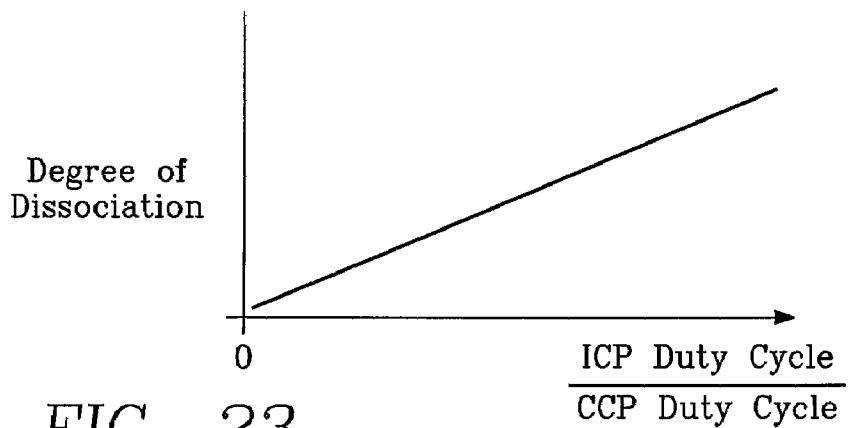
FIG. 23 is a graph depicting how the degree of dissociation (e.g., population of free carbon or free fluorine) increases with increasing ratio of inductively coupled power pulsed duty cycle to capacitively coupled power duty cycle.
Figure 24A:
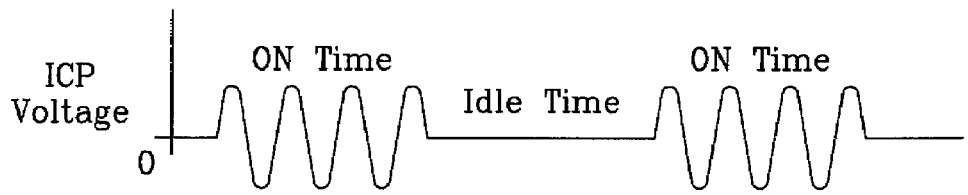
FIGS. 24A and 24B illustrate the contemporaneous waveforms of pulsed inductively coupled power and capacitively coupled power, respectively.
Figure 24B:
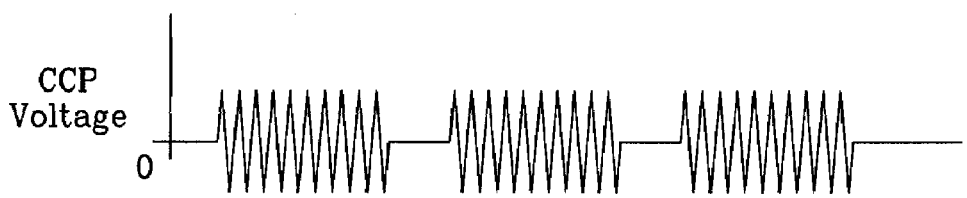

FIG. 23 is a graph illustrating one way of carrying out the step of block 310*b* of FIG. 18. The vertical axis of FIG. 23 corresponds to the degree of dissociation in the bulk plasma, and may represent the optical emission spectrum intensity of a highly dissociated species such as free carbon in FIG. 22. The horizontal axis is the ratio of inductively coupled plasma (ICP) pulsed duty cycle to capacitively coupled plasma (CCP) pulsed duty cycle (the pulsed duty cycles of the ICP and CCP generators 118, 122 of FIG. 1A). FIG. 23 indicates that the dissociation is a generally increasing function of this ratio, although it may not be the simple linear function depicted in FIG. 23. The CCP generator 122 may not be pulsed, in which case its duty cycle is 100%, while only the ICP duty cycle is varied to exert control. FIGS. 24A and 24B illustrate one possible example of the contemporaneous waveforms of the pulsed ICP generator output and the pulsed CCP generator output. In this illustrated example, the CCP generator 122 has a higher duty cycle than the ICP generator 118, so that the plasma is likely to exhibit more the characteristics of a capacitively coupled plasma, such as a low degree dissociation. The ratio between the duty cycles of the capacitively and inductively coupled power sources affects the proportion between inductively and capacitively coupled power in the plasma in the following way. First, the shorter the duty cycle of the inductively coupled power source, the longer the idle time between the pulsed bursts of RF inductive power. During the idle time, the highest energy electrons in the bulk plasma loose their energy faster than other less energetic electrons, so that the electron energy distribution function (FIG. 19) shifts downward in energy (i.e., to the left in FIG. 19). This leads to a more capacitively coupled-like plasma (i.e., less dissociation) during each idle time. This effect increases as duty cycle is decreased, so that the plasma has (on average over many cycles) less high energy electrons, leading to less dissociation. During the idle time, the higher energy electron distribution decays, and (in addition) spatial distribution of the higher energy electrons has an opportunity to spread through diffusion, thus improving process uniformity to a degree depending upon the reduction in inductively coupled power duty cycle.

Figure 25:
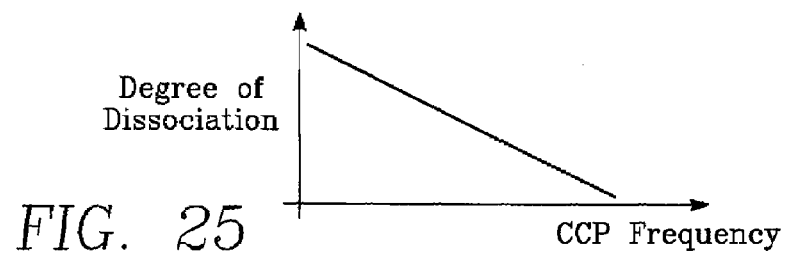
FIG. 25 is a graph illustrating how the degree of dissociation decreases with increasing frequency of capacitively coupled power.

FIG. 25 is a graph depicting one way of carrying out the step of block 310c of FIG. 18. The vertical axis of FIG. 25 corresponds to the degree of dissociation in the bulk plasma, and may represent the optical emission spectrum intensity of a highly dissociated species such as free carbon in FIG. 22. The horizontal axis is the frequency of the capacitively coupled plasma (CCP) generator 122 of FIG. 1A. FIG. 25 corresponds to the case in which both CCP and ICP power is applied simultaneously, as in the previous examples, and the frequency of the CCP power generator 122 is increased. For a fixed level of ICP power and a fixed level of CCP power, increasing the effective VHF frequency increases the plasma dissociation, as indicated in FIG. 25. The dissociation behavior may not be the simple linear function depicted in FIG. 25.

Figure 26A:
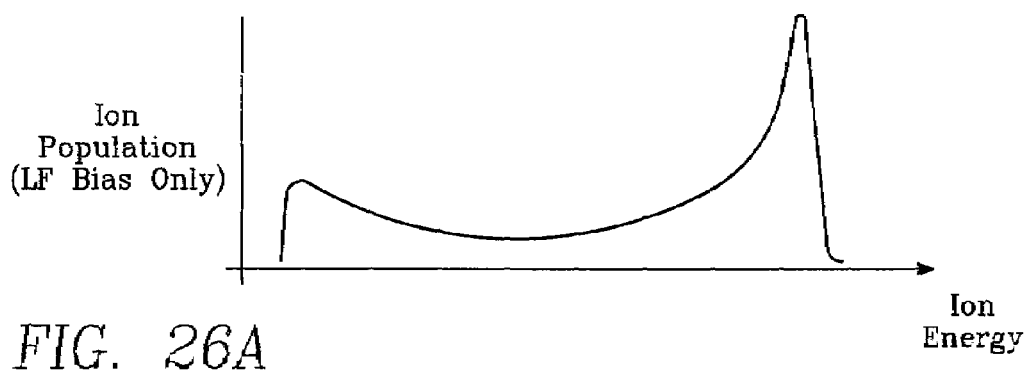
FIGS. 26A, 26B and 26C are graphs of sheath ion energy distribution for the cases in which only low frequency bias power is applied, only high frequency bias power is applied and both low and high frequency bias power is applied to the wafer, respectively.
Figure 26B:
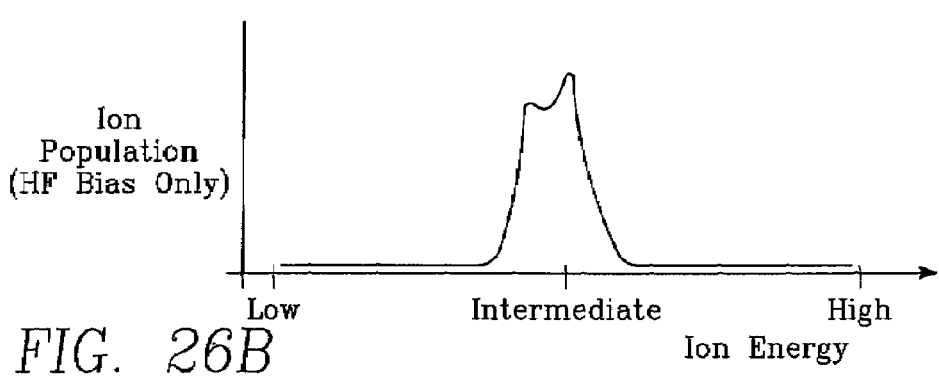
Figure 26C:
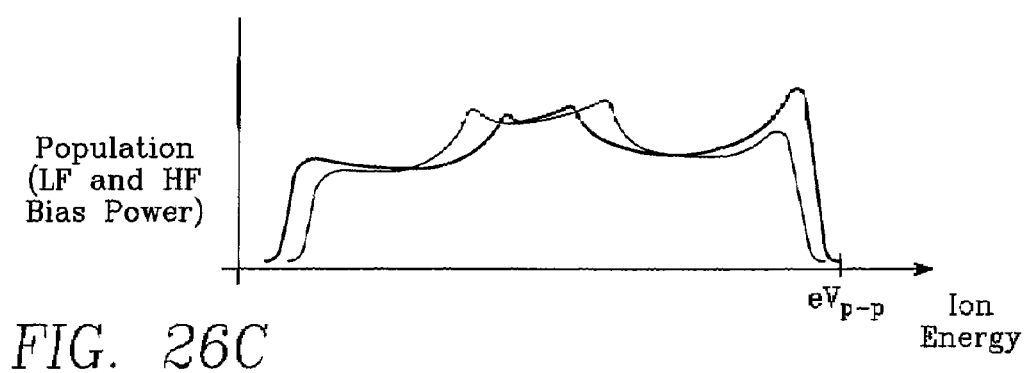

FIGS. 26A, 26B and 26C illustrate how the step of block 214 of FIG. 11 (which corresponds to or is the same as the step of block 314 of FIG. 18) is carried out. Each of the graphs of FIGS. 26A, 26B, 26C depicts the population of ions at the plasma sheath (at the workpiece surface) as a function of ion energy, or the sheath ion energy distribution.

FIG. 26A depicts the ion energy distribution in the case in which the only bias power that is applied to the wafer is a low frequency (e.g., 1 MHz) bias voltage or current. (In FIG. 1A, this corresponds to the case in which only the LF bias power generator 132 applies bias power.) This frequency is substantially below the sheath ion transit frequency, which is the highest frequency at which the sheath ions can follow an oscillation of the sheath electric field. Therefore, the sheath ions in the example of FIG. 26A can follow the peak-to-peak oscillations of the sheath electric field imposed by the bias power. This results in a peak ion energy that coincides with the RF bias power peak-to-peak voltage (labeled eVp-p in FIG. 26A). The ion energy distribution is bi-modal and has a second peak at a much lower energy, as depicted in the graph of FIG. 26A. The ion distribution between these two peaks is relatively low.

FIG. 26B depicts the ion energy distribution in the case in which the bias power consists only of a high frequency (HF) component (such as 13.56 MHz). (In FIG. 1A, this corresponds to the case in which only the HF bias power generator 134 applies bias power.) This frequency is well above the sheath ion transit frequency, and therefore the sheath ions are unable to follow the peak-to-peak sheath electric field oscillation. The result is that the ion energy distribution of FIG. 26B is confined to a narrow energy band centered at half of the peak-to-peak voltage of the sheath. The ion energy distributions of FIGS. 26A and 26B can be seen to be somewhat complementary to one another, with one distribution (FIG. 26B) being rich in a middle frequency band while the other (FIG. 26A) peaks at two extremes, has a wide distribution that is somewhat depleted at the middle frequencies.

FIG. 26C illustrates an example of an ion energy distribution that can be realized by applying both LF and HF bias power simultaneously (by enabling both bias power generators 132, 134 of FIG. 1A). This results in an ion energy distribution that is, in effect, a superposition of the two extreme distributions of FIGS. 26A and 26B. The "combination" ion energy distribution of FIG. 26C is therefore adjustable by adjusting the relative amounts of LF and HF bias power. This is accomplished by either (or both) apportioning the power levels of the LF and HF bias power generators 132, 134 (as in step 214a of FIG. 11 or pulsing one or both of them and apportioning their duty cycles (as in step 214b of FIG. 11). Alternatively, or as an additional step, the frequency of either the HF or the LF bias power may be changed. For example, the LF bias power frequency may be increased to a value closer to the sheath ion transit frequency, which would reduce the ion energy distribution population near the maximum energy (eVp-p) in FIG. 26C (thereby narrowing the ion energy distribution as indicated by the dotted line curve of FIG. 26C). As another example, the HF bias power frequency can be reduced to a value closer to the sheath ion transit frequency, which would decrease the distribution peak at the intermediate energies of FIG. 26C (thereby broadening the ion energy distribution in the middle frequencies as indicated by the dashed line of FIG. 26C).

While the invention has been described with specific reference to preferred embodiments, it is understood that variations and modifications thereof may be made without departing from the true spirit and scope of the invention.

What is claimed is:

1. A method of processing a workpiece in the chamber of a plasma reactor having a ceiling overlying the workpiece, comprising:

introducing a process gas into the chamber through a gas distribution plate in the ceiling, by distributing gas flow from a first gas input to plural gas distribution orifices extending through a manifold of said gas distribution plate, and distributing gas flow from each of said plural gas distribution orifices to plural gas injection orifices in a showerhead of said gas distribution plate;

wherein distributing said gas flow from said first gas input to said plural gas distribution orifices comprises distributing said gas flow through a succession of arcuate paths defined by respective axes of arcuate rotation transverse to said ceiling and joined at respective junctions, and dividing gas flow at each one of said junctions from a respective one of said gas flow paths flowing into the one junction into a respective pair of said gas flow paths flowing out of the one junction in opposite rotational directions;

restricting gas flow in said arcuate paths to arcuate lengths less than complete circles; and simultaneously (a) capacitively coupling VHF plasma source power from a VHF source into a process region of the chamber that overlies the wafer from an electrode within said gas distribution plate, and (b) inductively coupling RF plasma source power from an RF source independent of said VHF source into said process region from a coil antenna overlying said gas distribution plate.

2. The method of claim 1 further comprising:

adjusting plasma ion density in said process region by adjusting a total amount of capacitively coupled VHF plasma source power and inductively coupled RF plasma source power and adjusting the plasma ion density radial distribution in said process region independently of said density by adjusting the ratio between the amounts of capacitively coupled VHF plasma source power and inductively coupled RF plasma source power.

3. The method of claim 1 further comprising:

for each one of said junctions, providing the two paths of each of said pair of paths flowing out of the one junction with generally the same path length, whereby the total path distances from said first gas input to respective ones of said gas distribution orifices are generally uniform.

4. The method of claim 1 further comprising:

applying independently adjustable LF bias power and HF bias power to said workpiece; and adjusting the average value and population distribution of ion energy at the surface of said workpiece by adjusting the ratio between said LF and HF bias powers.

5. The method of claim 1 further comprising adjusting the extent of dissociation of species in the plasma by adjusting the effective frequency of said capacitively coupled VHF source power.

6. The method of claim 5 wherein the adjusting of the effective frequency of said capacitively coupled VHF source power comprises adjusting the ratio between the output power levels of a pair of VHF power generators having different fixed frequencies and coupled to deliver VHF power to said process region.

7. The method of claim 6 wherein the step of adjusting said ratio comprises:
adjusting the power levels of said capacitively coupled RF plasma source power and said inductively coupled RF plasma source power.

8. The method of claim 6 wherein the step of adjusting said ratio comprises:
pulsing at least said inductively coupled RF plasma source power and adjusting the ratio between the duty cycles of said inductively coupled plasma source power and said capacitively coupled plasma source power.

9. The method of claim 1 further comprising adjusting the chemical species content of plasma in said process region by adjusting the residency time of said process gas in said chamber.

10. The method of claim 9 wherein the step of adjusting the residency time comprises adjusting an evacuation rate of process gas in said chamber.

11. The method of claim 9 wherein the step of adjusting the residency time comprises adjusting a distance between said workpiece and a ceiling of said chamber.

12. A method of processing a workpiece in the chamber of a plasma reactor having a ceiling overlying the workpiece, comprising:
introducing a process gas into the chamber through a gas distribution plate in the ceiling, by evenly distributing gas flow from a first gas input to plural gas distribution orifices extending through a manifold of said gas distribution plate, and evenly distributing gas flow from each of said plural gas distribution orifices to N gas injection orifices in a showerhead of said gas distribution plate;
distributing said gas flow from said first gas input to said plural gas distribution orifices through a succession of arcuate paths joined at respective junctions, and dividing gas flow at each junction from a first respective one of said gas flow paths into a respective pair of said gas flow paths in opposite gas flow directions;
restricting gas flow in said paths to arcuate lengths less than complete circles; and
simultaneously (a) capacitively coupling VHF plasma source power into a process region of the chamber that overlies the wafer from an electrode within said gas distribution plate, and (b) inductively coupling RF plasma source power into said process region from a coil antenna overlying said gas distribution plate.

13. The method of claim 12 further comprising:
controlling plasma ion density in said process region by adjusting a total amount of capacitively coupled VHF plasma source power and inductively coupled RF plasma source power; and
adjusting the plasma ion density radial distribution in said process region by adjusting the ratio between the amounts of capacitively coupled VHF plasma source power and inductively coupled RF plasma source power.

14. The method of claim 13 wherein said ratio is adjusted along a line of constant plasma density.

15. The method of claim 12 further comprising applying independently adjustable LF bias power and HF bias power to said workpiece; and adjusting the average value and population distribution of ion energy at the surface of said workpiece by adjusting the ratio between said LF and HF bias powers.

16. The method of claim 15 further comprising adjusting the average value and population distribution of ion energy at the surface of said workpiece by adjusting the ratio between said LF and HF bias powers.

17. The method of claim 13 wherein the control of plasma ion density and the adjustment of dissociation are performed substantially independently of one another.

18. The method of claim 13 further comprising adjusting the extent of dissociation of species in the plasma by adjusting the effective frequency of said capacitively coupled VHF source power.

19. The method of claim 18 wherein the adjusting of the effective frequency of said capacitively coupled VHF source power comprises adjusting the ratio between the output power levels of a pair of VHF power generators having different fixed frequencies and coupled to deliver VHF power to said process region.

20. The method of claim 12 wherein the step of adjusting said ratio comprises:
adjusting the power levels of said capacitively coupled RF plasma source power and said inductively coupled RF plasma source power.

21. The method of claim 12 wherein the step of adjusting said ratio comprises:
pulsing at least said inductively coupled RF plasma source power and adjusting the ratio between the duty cycles of said inductively coupled plasma source power and said capacitively coupled plasma source power.

* * * * *